(12) United States Patent
Kim et al.

(10) Patent No.: US 10,629,133 B2
(45) Date of Patent: Apr. 21, 2020

(54) GATE DRIVING CIRCUIT AND DISPLAY DEVICE INCLUDING THE SAME

(71) Applicant: LG Display Co., Ltd., Seoul (KR)

(72) Inventors: Min Su Kim, Paju-si (KR); Byung Jun Lim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 66 days.

(21) Appl. No.: 15/799,809

(22) Filed: Oct. 31, 2017

(65) Prior Publication Data

US 2019/0035322 A1 Jan. 31, 2019

(30) Foreign Application Priority Data

Jul. 28, 2017 (KR) .................. 10-2017-0096143

(51) Int. Cl.
*G09G 3/3266* (2016.01)
*H01L 27/12* (2006.01)
*G09G 3/3233* (2016.01)
*G09G 3/20* (2006.01)
*H01L 29/786* (2006.01)

(52) U.S. Cl.
CPC ......... *G09G 3/3266* (2013.01); *G09G 3/3233* (2013.01); *H01L 27/1222* (2013.01); *H01L 27/1225* (2013.01); *H01L 27/1251* (2013.01); *G09G 3/2092* (2013.01); *G09G 2300/0426* (2013.01); *G09G 2300/0809* (2013.01); *G09G 2300/0819* (2013.01); *G09G 2300/0842* (2013.01); *G09G 2300/0861* (2013.01); *G09G 2310/0286* (2013.01); *G09G 2310/08* (2013.01); *G09G 2320/0247* (2013.01); *G09G 2330/021* (2013.01); *H01L 29/7869* (2013.01); *H01L 29/78672* (2013.01)

(58) Field of Classification Search
CPC ... G09G 2300/0426; G09G 2300/0809; G09G 2310/08; G09G 2320/0247; G09G 2330/021; H01L 27/1225; H01L 29/78672; H01L 29/7869
See application file for complete search history.

(56) References Cited

U.S. PATENT DOCUMENTS

| | | | | |
|---|---|---|---|---|
| 2015/0294733 A1* | 10/2015 | Tan | ........................ | G11C 19/28 345/204 |
| 2016/0180790 A1* | 6/2016 | Park | ........................ | G09G 3/34 345/92 |

(Continued)

*Primary Examiner* — Kent W Chang
*Assistant Examiner* — Sujit Shah
(74) *Attorney, Agent, or Firm* — Fenwick & West LLP

(57) ABSTRACT

Disclosed is a display device including a gate driving circuit. The display device comprises a substrate including a display area and a non-display area, a pixel circuit in the display area, and a pair of scan driving circuits in the non-display area, the pair of scan driving circuits generating output signals inverted therebetween. The pixel circuit includes at least one n-type transistor and at least one p-type transistor, one of the pair of scan driving circuits includes a first transistor and a third transistor each including a gate electrode connected to a first node and a second transistor and a fourth transistor each including a gate electrode connected to a second node, the first transistor and the second transistor are serially connected to each other, and the third transistor and the fourth transistor are serially connected to each other.

13 Claims, 9 Drawing Sheets

(56) References Cited

U.S. PATENT DOCUMENTS

| | | | |
|---|---|---|---|
| 2016/0351160 A1* | 12/2016 | In .......................... | G09G 3/3225 |
| 2017/0098420 A1* | 4/2017 | Kang ................... | G09G 3/3677 |
| 2017/0110050 A1* | 4/2017 | Park ..................... | G09G 3/3266 |
| 2017/0147121 A1* | 5/2017 | Yang ....................... | G06F 3/044 |
| 2017/0186363 A1* | 6/2017 | Park ..................... | G09G 3/2092 |

* cited by examiner

GATE DRIVING CIRCUIT AND DISPLAY DEVICE INCLUDING THE SAME

CROSS-REFERENCE TO RELATED APPLICATIONS

This patent application claims the priority of Republic of Korea Patent Application No. 10-2017-0096143 filed on Jul. 28, 2017, in the Korean Intellectual Property Office, the disclosure of which is incorporated herein by reference in its entirety.

BACKGROUND

Field

The present disclosure relates to a gate driving circuit and a display device including the same, and more particularly to a gate driving circuit and a display device including the same, in which a narrow-bezel display device is implemented by reducing the number of transistors configuring the gate driving circuit.

Discussion of the Related Art

Presently, various display devices have been developed and become commercially available. For example, examples of the display devices include liquid crystal display (LCD) devices, field emission display (FED) devices, electrophoretic display (EPD) devices, electro-wetting display (EWD) devices, organic light emitting display (OLED) devices, quantum dot display (QD) devices, etc.

As various technologies for implementing the display devices have been developed and various products are produced, technology for implementing a design desired by consumers is advancing rather than technology for operating the display devices. One of the technologies is for maximizing a display screen. This is because by minimizing a non-display area (i.e., a bezel) surrounding a display screen and maximizing a size of the display screen, a sense of immersion of a user in the display screen is enhanced, and designs of products are diversified.

A plurality of driving circuits for transferring a driving signal to a pixel array configuring a display screen are disposed in a bezel. When a signal supplied from each of the driving circuits drives a pixel circuit, the pixel array emits light. A gate driving circuit is provided for transferring a gate signal to a gate line of the pixel circuit, and a data driving circuit is provided for transferring a data signal to a data line of the pixel circuit. The gate driving circuit may include a scan driving circuit for controlling gate electrodes of scan transistors or switch transistors of the pixel circuit and an emission driving circuit for controlling gate electrodes of emission transistors. Therefore, the bezel is reduced by reducing an area where the gate driving circuit and the data driving circuit are provided.

SUMMARY

Accordingly, the present disclosure is directed to provide a gate driving circuit and a display device including the same that substantially obviate one or more problems due to limitations and disadvantages of the related art.

As a resolution of display devices increases and power consumption increases, technology for reducing the power consumption of the display devices is being developed. In order to decrease the power consumption, pixels may be driven at a low speed by lowering a frame rate during a specific duration. For example, in mobile models, normal driving based on 60 Hz or 120 Hz is performed in an actual use mode, and driving based on 1 Hz is performed in a standby mode, thereby decreasing the power consumption.

In low-speed driving, a data updating period becomes long, and for this reason, if a leakage current occurs in a pixel, flicker can be seen. Therefore, if a switch transistor of which an off period is long is implemented with an n-type oxide transistor of which an off current is low, a leakage current is reduced in low-speed driving, thereby decreasing flicker. Also, a driving transistor of a pixel circuit is high in mobility, and thus, may be implemented with a p-type polycrystalline transistor having low power consumption and good reliability. That is, a display panel including a pixel circuit including both an n-type transistor and a p-type transistor needs individual scan driving circuits for respectively controlling the n-type transistor and the p-type transistor. Also, a turn-on voltage for turning on the n-type transistor differs from a turn-on voltage for turning on the p-type transistor, and thus, one of the scan driving circuits should include an inverter. Since the display panel further includes the inverter in addition to the scan driving circuit and the emission driving circuit, an area occupied by the gate driving circuit increases, and for this reason, it is difficult to implement a narrow-bezel display device.

Therefore, due to the above-described problems, and a gate driving circuit having a reduced size and a display device including the same has been invented.

An aspect of the present disclosure is directed to provide a gate driving circuit which, without using an inverter, supplies a gate voltage to a gate electrode of an n-type transistor or a p-type transistor in a display device including the n-type transistor and the p-type transistor.

Another aspect of the present disclosure is directed to provide a display device including an n-type transistor and a p-type transistor, where the number of elements of a gate driving circuit for supplying a gate voltage to a gate electrode of the n-type transistor or the p-type transistor is reduced, and thus, a reliability of the gate driving circuit is enhanced.

The objects of the present disclosure are not limited to the aforesaid, but other objects not described herein will be clearly understood by those skilled in the art from descriptions below.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display device comprising a substrate including a display area and a non-display area, a pixel circuit in the display area, and a pair of scan driving circuits in the non-display area, the pair of scan driving circuits generating output signals inverted therebetween, wherein the pixel circuit includes at least one n-type transistor and at least one p-type transistor. One of the pair of scan driving circuits comprises a first transistor and a third transistor each including a gate electrode connected to a first node and a second transistor and a fourth transistor each including a gate electrode connected to a second node, the first transistor and the second transistor are serially connected to each other, and the third transistor and the fourth transistor are serially connected to each other. A second output signal applied to a node shared by the third transistor and the fourth transistor is a signal obtained by inverting a first output signal applied to a node shared by the first transistor and the second transistor. Accordingly, the number of elements of the gate driving circuit for providing a gate signal to the n-type transistor and the p-type transistor is minimized to enhance reliability, and an area where the gate driving circuit is disposed is reduced, thereby implementing a narrow-bezel display device.

In another aspect of the present disclosure, there is provided a gate driving circuit comprising a first scan driving circuit and a second driving circuit on a substrate. The first scan driving circuit and the second driving circuit each comprise a plurality of first scan stages and a plurality of second scan stages, an nth (where n is a natural number) first scan stage of the plurality of first scan stages and an nth second scan stage of the plurality of second scan stages each include the same circuit including a first transistor and a second transistor serially connected to each other, the nth first scan stage includes a third transistor connected to a gate electrode of the first transistor and a fourth transistor connected to a gate electrode of the second transistor, and an output signal of the nth first scan stage is generated by inverting an output signal of the nth second scan stage. Accordingly, the number of elements of the gate driving circuit for generating output signals inverted therebetween is minimized to enhance a reliability of the gate driving circuit.

In another aspect of the present disclosure, there is provided a display device comprising a substrate including a display area and a non-display area, a pixel circuit in the display area, and a gate driving circuit in the non-display area. The gate driving circuit includes a scan driving circuit, the scan driving circuit includes a plurality of scan stages, the plurality of scan stages each include a first transistor and a third transistor each including a gate electrode connected to a Q node and a second transistor and a fourth transistor each including a gate electrode connected to a QB node, and an output signal generated in a node shared by the third transistor and the fourth transistor serially connected to each other is a signal obtained by inverting an output signal generated in a node shared by the first transistor and the second transistor serially connected to each other. Accordingly, the number of elements of the gate driving circuit for providing a gate signal to the n-type transistor and the p-type transistor is minimized to enhance reliability, and an area where the gate driving circuit is disposed is reduced, thereby implementing a narrow-bezel display device.

In addition to the aforesaid objects of the present disclosure, other objects and features of the present disclosure will be described in the detailed description of the disclosure and claims to be described below.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
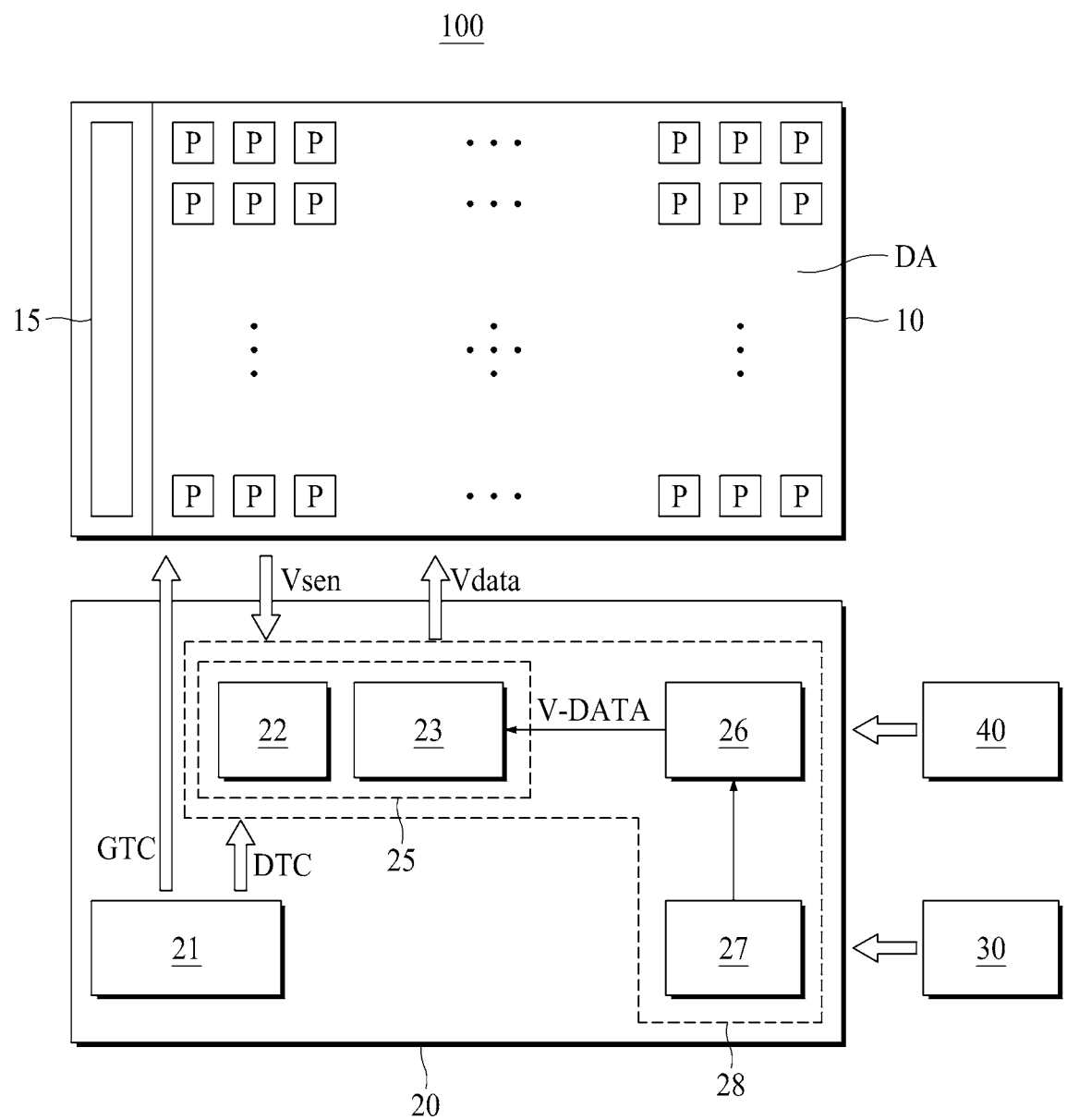
FIG. 1 is a block diagram illustrating a display device according to an embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the present disclosure, a pixel circuit and a gate driving circuit provided on a substrate of a display panel may each be implemented with an n-type or p-type transistor. For example, the transistor may be implemented with a transistor having a metal oxide semiconductor field effect transistor (MOSFET) structure. The transistor may be a three-electrode device including a gate, a source, and a drain. The source may be an electrode which supplies a carrier to the transistor. In the transistor, the carrier may start to flow from the source. The drain may be an electrode through which the carrier flows from the transistor to the outside. For example, in the transistor, the carrier may flow from the source to the drain. In an n-type transistor, since the carrier is an electron, a source voltage may be lower than a drain voltage in order for the electron to flow from the source to the drain. In the n-type transistor, since the electron flows from the source to the drain, a current may flow from the drain to the source. In a p-type transistor, since the carrier is a hole, a source voltage may be higher than a drain voltage in order for the hole to flow from the source to the drain. In the p-type transistor, since the hole flows from the source to the drain, a current may flow from the source to the drain. The source and the drain of the transistor may not be fixed and may be switched therebetween according to an applied voltage.

In this disclosure below, a gate on voltage may be a voltage of a gate signal for turning on a transistor. A gate off voltage may be a voltage for turning off the transistor. In a p-type transistor, the gate on voltage may be a logic low voltage VL, and the gate off voltage may be a logic high voltage VH. In an n-type transistor, the gate on voltage may be a logic high voltage, and the gate off voltage may be a logic low voltage.

Hereinafter, a gate driving circuit and a display panel including the same according to an embodiment of the present disclosure will be described with reference to the accompanying drawings.

FIG. 1 is a block diagram illustrating a display device 100 according to an embodiment of the present disclosure. FIG. 1 is a block diagram illustrating, for example, a display device including a pixel circuit capable of external compensation, and the element of the display device is not limited thereto.

The display device 100 may include a display panel 10, a drive integrated circuit (IC) 20, a memory 30, and a host system 40.

In the display panel 10, a screen displaying an input image may include a plurality of pixels P connected to a plurality of signal lines. The pixels P may each include red, green, and blue subpixels for realizing a color, and may further include a white subpixel without being limited thereto. An area where the pixels P are provided to display the screen may be referred to as a display area DA, and an area other than the display area DA may be referred to as a non-display area. The non-display area may be referred to as a bezel.

The signal lines may include a plurality of data lines, through which analog data voltages Vdata are supplied to the pixels P, and a plurality of gate lines through which a gate signal is supplied to the pixels P. The gate signal may include two or more signals, based on a configuration of a pixel circuit. The below-described pixel circuit may include a first scan signal Scan1, a second scan signal Scan2, and an emission signal EM. The signal lines may further include a plurality of sensing lines used to sense an electrical characteristic of the pixels P.

The pixels P of the display panel 10 may be arranged in a matrix type to configure a pixel array, but are not limited thereto. The pixels P may be arranged in various types such as a pixel sharing type, a stripe type, and a diamond type, in addition to the matrix type. Each pixel P may be connected to at least one of the data lines, at least one of the sensing lines, and at least one of the gate lines. Each pixel P may be supplied with a high level power voltage and a low level power voltage from a power generator. The power generator may supply the high level power voltage to the pixels P through a high level power voltage line. Also, the power generator may supply the low level power voltage to the pixels P through a low level power voltage line. The power generator may be included in the drive IC 20.

The drive IC 20 may include a data driving circuit 28 that modulates input image data with a predetermined compensation value of the pixel P, based on an electrical characteristic sensing result of the pixel P and generates a data voltage corresponding to modulation data V-DATA generated through the modulation and a timing controller 21 that controls an operation timing of the data driving circuit 28 and an operation timing of a gate driving circuit 15. The data driving circuit 28 of the drive IC 20 may add the predetermined compensation value to the input image data to generate compensation data, convert the compensation data into a data voltage Vdata, and supply the data voltage Vdata to the data line. The data driving circuit 28 may include a data driver 25, a compensator 26, and a compensation memory 27.

The data driver 25 may include a sensing unit 22 and a data voltage generator 23, but is not limited thereto.

The timing controller 21 may generate timing signals from an image signal input from the host system 40. For example, the timing controller 21 may generate a gate timing control signal GTC for controlling an operation timing of the gate driving circuit 15 and a data timing control signal DTC for controlling an operation timing of the data driving circuit 25, based on a vertical sync signal, a horizontal sync signal, a dot clock signal, and a data enable signal.

The data timing control signal DTC may include a source start pulse, a source sampling clock, and a source output enable signal, but is not limited thereto. The source start pulse may control a data sampling start timing of the data voltage generator 23. The source sampling clock may be a clock signal that controls a data sampling timing with respect to a rising edge or a falling edge. The source output enable signal may control an output timing of the data voltage generator 23.

The gate timing control signal GTC may include a gate start pulse and a gate shift clock, but is not limited thereto. The gate start pulse may be applied to a stage that generates a first output, and may activate an operation of the stage. The gate shift clock may be a common clock signal that is input to a plurality of stages, and may be a clock signal for shifting the gate start pulse.

In a normal driving mode of reproducing an input image on the screen, the data voltage generator 23 may generate data voltages Vdata corresponding to the input image by using a digital-to-analog converter (DAC) that converts a digital signal into an analog signal, and may supply the data voltages to the pixels P through the data lines.

In a sensing mode for measuring an electrical characteristic deviation of the pixels P before a product is released or while the product is being driven, the data voltage generator 23 may convert test data received from a gray-luminance measurement system to generate a sensing data voltage and may supply the sensing data voltage to a sensing target pixel P of the display panel 10 through a corresponding data line. The gray-luminance measurement system may sense an electrical characteristic of each of the pixels P, calculate a compensation value of the pixel P for compensating for an electrical characteristic deviation (particularly, a threshold voltage deviation of a driving transistor) between the pixels P, based on a sensing result and store the compensation value of the pixel P in the memory 30 or update a previously stored value. The memory 30 may be implemented with a compensation memory 27 as one memory. Also, the memory 30 may be a flash memory, but is not limited thereto.

The gray-luminance measurement system applied to the sensing mode may be electrically connected to the memory 30 when executing the sensing mode.

In the normal driving mode, when power is applied to the display device 100, the compensation value may be loaded from the memory 30 into the compensation memory 27 of the drive IC 20. The compensation memory 27 of the drive IC 20 may be a double date rate synchronous dynamic random access memory (DDR SDRAM) or a synchronous dynamic random access memory (SDRAM), but is not limited thereto.

The sensing unit 22 may sample a source voltage of the driving transistor based on a current of the driving transistor to sense an electrical characteristic of the driving transistor. In an aging process before a product is released, the sensing unit 22 may sense an electrical characteristic of each of the pixels P and may transmit the sensed electrical characteristic to the gray-luminance measurement system.

The compensator 26 may modulate input image data with the compensation value read from the compensation memory 27 and may transmit the modulation data V-DATA to the data voltage generator 23.

The host system 40 may be one of a television (TV) system, a set-top box, a navigation system, a personal computer (PC), a home theater system, a mobile system, a wearable system, and a virtual reality system. FIG. 1 illustrates a configuration of the mobile system, and a configuration of a driving circuit of the display device may be modified based on the host system 40.

Figure 2A:
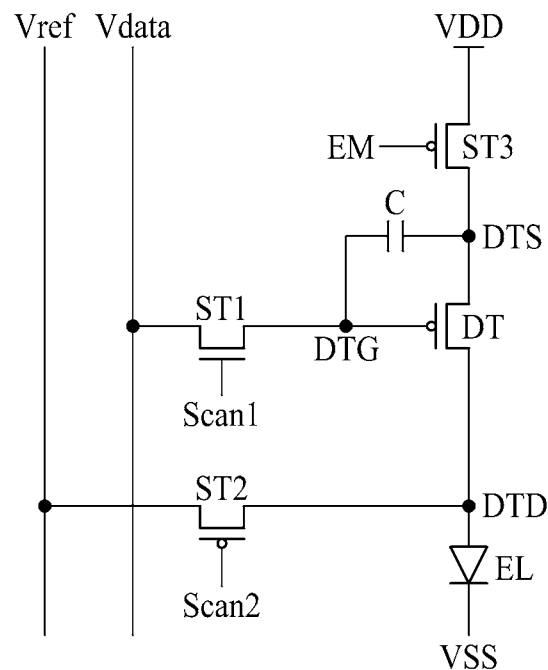
FIG. 2A is a diagram illustrating a pixel circuit according to an embodiment of the present disclosure.
Figure 2B:
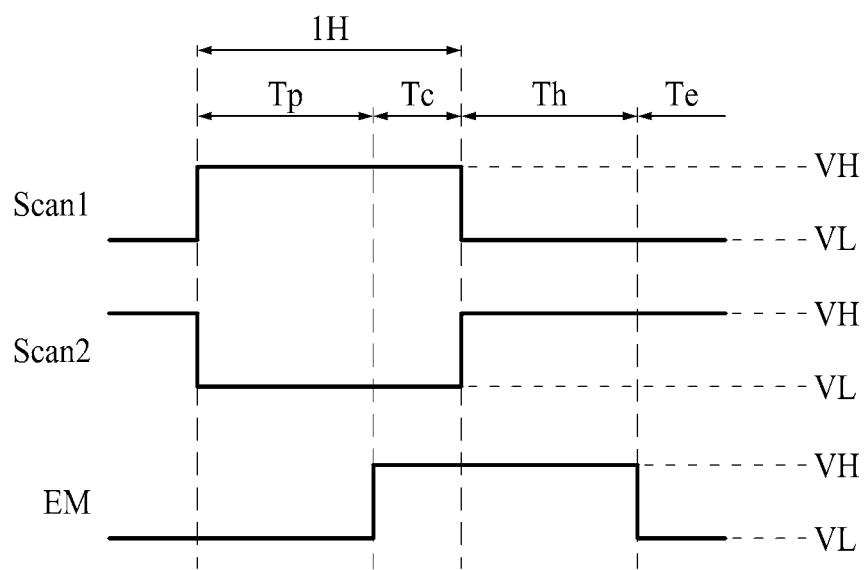
FIG. 2B is a diagram showing a driving signal waveform of the pixel circuit illustrated in FIG. 2A.

FIG. 2A is a diagram illustrating a pixel circuit according to an embodiment of the present disclosure. FIG. 2B is a diagram showing a driving signal waveform of the pixel circuit illustrated in FIG. 2A. In FIG. 2B, 1H denotes one horizontal period where data is written in a pixel.

The pixel circuit of FIG. 2A may include a light emitting device EL, a driving transistor DT, a capacitor C, a first switch transistor ST1, a second switch transistor ST2, and a third switch transistor ST3. The first switch transistor ST1 may be implemented with an n-type transistor, and the driving transistor DT, the second switch transistor ST2, and the third switch transistor ST3 may each be implemented with a p-type transistor. In FIG. 2A, an example where only the first switch transistor ST1 is implemented with the n-type transistor is illustrated, but the present embodiment is not limited thereto. FIGS. 3 to 10 to be described below may be applied to a case where the first switch transistor ST1, the second switch transistor ST2, the third switch transistor ST3, and the driving transistor DT are implemented with two kinds of transistors such as an n-type transistor and a p-type transistor. Also, in FIG. 2A, an external compensation pixel circuit and an internal compensation pixel circuit which are each implemented with four transistors and one capacitor are illustrated for example, but are not limited thereto. In other embodiments, the external compensation pixel circuit or the internal compensation pixel circuit may be implemented with two kinds of transistors such as an n-type transistor and a p-type transistor.

In FIG. 2A, a threshold voltage of the driving transistor DT may be compensated for by using an external compensation method, and a mobility deviation of the driving transistor DT may be compensated for by using an internal compensation method.

Referring to FIG. 2A, the first switch transistor ST1 may be an oxide transistor. The oxide transistor may be implemented with a transistor including an oxide semiconductor layer where an off current is low. The off current may be a leakage current which flows between a source and a drain of a transistor in an off state of the transistor. In a transistor where the off current is low, although the off state is long, since a leakage current is small, a luminance variation of each of pixels is reduced when driving the pixels at a low speed. For example, low-speed driving may be 1 Hz driving.

The driving transistor DT, the second switch transistor ST2, and the third switch transistor ST3 may each be a polysilicon transistor. The polysilicon transistor may be implemented with a transistor including a semiconductor layer formed of low temperature poly silicon (LTPS) having high mobility.

In the display device according to an embodiment of the present disclosure, when a still image is being displayed, the pixels may be driven at a low speed by lowering a frame rate, thereby reducing the power consumption. In this case, a data updating period becomes long, and for this reason, if a leakage current occurs in the pixels, flicker can occur. When a luminance of the pixels varies periodically, a user can perceive flicker. If the first switch transistor ST1 having a long off period uses a transistor including an oxide semiconductor layer, flicker is reduced by decreasing a leakage current in low-speed driving.

Referring to FIGS. 2A and 2B, a first scan signal Scan1, a second scan signal Scan2, and an emission signal EM may be applied to the pixel circuit. Each of the first scan signal Scan1, the second scan signal Scan2, and the emission signal EM may swing between a logic high voltage VH and a logic low voltage VL. The first scan signal Scan1 may be generated as a gate on voltage VH for an initialization time Tp and a compensation time Tc in one frame period, and for a holding time Th and after the holding time Th, the first scan signal Scan1 may be generated as a gate off voltage VL. The second scan signal Scan2 may be generated as the gate on voltage VL for the initialization time Tp and the compensation time Tc, and for the holding time Th and after the holding time Th, the second scan signal Scan2 may be generated as the gate off voltage VH. The emission signal EM may be generated as the gate on voltage VL for the initialization time Tp and an emission time Te and after the emission time Te, and for the compensation time Tc and the holding time Th, the emission signal EM may be generated as the gate off voltage VH. The emission signal EM may be generated as the gate off voltage VH for a predetermined time after the emission time Te.

The light emitting device EL may include an organic compound layer provided between an anode and a cathode. The organic compound layer may include a hole injecting layer HIL, a hole transporting layer HTL, a light emitting layer EML, an electron transporting layer ETL, and an electron injecting layer EIL, but is not limited thereto. The cathode of the light emitting device EL may be connected to a low level power voltage VSS, and the anode may be connected to a drain electrode of the driving transistor DT.

The driving transistor DT may be a driving device which adjusts a current flowing in the light emitting device EL according to a gate-source voltage. The driving transistor DT may include a gate electrode connected to a first node DTG, a drain electrode connected to the second node DTD, and a source electrode connected to a third node DTS. The first node DTG may be connected to the gate electrode of the driving transistor DT, one electrode of the capacitor C, and a source electrode of the first switch transistor ST1. The capacitor C may be connected between the first node DTG and the third node DTS. A high level power voltage VDD may be applied to the driving transistor DT through the third node DTS.

The first switch transistor ST1 may be turned on according to the first scan signal Scant to supply a data voltage Vdata to the first node DTG for the initialization time Tp and the compensation time Tc. The first switch transistor ST1 may include a gate electrode to which the first scan signal Scant is applied, a drain electrode to which the data voltage Vdata is applied, and a source electrode which is connected to the gate electrode of the driving transistor DT through the first node DTG.

The second switch transistor ST2 may be turned on according to the second scan signal Scan2 to form a current path between a sensing line and the second node DTD for the initialization time Tp and the compensation time Tc. The second switch transistor ST2 may include a gate electrode to which the second scan signal Scan2 is applied, a source electrode to which a reference voltage Vref is applied, and a drain electrode which is connected to the drain electrode of the driving transistor DT and an anode of the light emitting device EL through the second node DTD. The reference voltage Vref may be a voltage which is lower than the high level power voltage VDD and the data voltage Vdata.

The third switch transistor ST3 may be connected between the source electrode of the driving transistor DT and a high level power voltage line through which the high level power voltage VDD is supplied, and in response to the emission signal EM, the third switch transistor ST3 may provide a current path between the driving transistor DT and the high level power voltage line. The third switch transistor ST3 may be turned on according to the gate on voltage VL of the emission signal EM to supply the high level power voltage VDD to the source electrode of the driving transistor DT through the third node DTS for the initialization time Tp and the emission time Te. The third switch transistor ST3 may be turned off according to the gate off voltage VH of the emission signal EM to block a current path between the high level power voltage VDD and the third node DTS for the compensation time Tc and the holding time Th. The third switch transistor ST3 may include a gate electrode to which the emission signal EM is applied, a drain electrode which is connected to the source electrode of the driving transistor DT through the third node DTS, and a source electrode to which the high level power voltage VDD is applied through the high level power voltage line.

For the initialization time Tp, the first to third switch transistors ST1 to ST3 may all be turned on according to the gate on voltage VH/VL of each of the first scan signal Scan1, the second scan signal Scan2, and the emission signal EM. At this time, the data voltage Vdata may be applied to the first node DTG, and the reference voltage Vref may be applied to the second node DTD. For the initialization time Tp, a voltage of the second node DTD may be initialized to the reference voltage Vref, and a voltage of the third node DTS may be initialized to the high level power voltage VDD. For the initialization time Tp, the driving transistor DT may be turned on because a source voltage is threshold voltage Vth or higher than a gate voltage.

Subsequently, a mobility of the driving transistor DT may be compensated for in real time for the compensation time Tc. The first switch transistor ST1 may maintain an on state because the first scan signal Scan1 maintains the gate on voltage VH, and the second switch transistor ST2 may maintain an on state because the second scan signal Scan2 maintains the gate on voltage VL. The emission signal EM may be inverted into the gate off voltage VH, and thus, the third switch transistor ST3 may be turned off. For the compensation time Tc, the first node DTG connected to the gate electrode of the driving transistor DT may maintain a connection with a data line, and thus, a gate voltage of the driving transistor DT may be maintained as the data voltage Vdata. Also, the second node DTD connected to the drain electrode of the driving transistor DT may maintain a connection with the sensing line, and thus, a drain voltage of the driving transistor DT may be maintained as the reference voltage Vref. Also, the third node DTS connected to the source electrode of the driving transistor DT may be disconnected from the high level power voltage VDD. For the compensation time Tc, the driving transistor DT may maintain a turn-on state, and thus, based on a mobility of the driving transistor DT, a discharging amount of a source voltage of the driving transistor DT may increase. In detail, for the compensation time Tc, the source voltage of the driving voltage DT may vary based on the mobility of the driving transistor DT.

In each of the pixels, for a real-time mobility compensation time Tc, the constant gate voltage of the driving transistor DT may be maintained, and the source voltage of the driving transistor DT may vary based on the mobility of the driving transistor DT, thereby compensating for a mobility deviation between the driving transistors of the pixels in real time.

During the holding time Th, the first scan signal Scan1 and the second scan signal Scan2 may be inverted into the gate off voltage VH, VL, and thus, the first and second switch transistors ST1 and ST2 may be turned off. Also, the emission signal EM may maintain the gate off voltage VH, and thus, the third switch transistor ST3 may be maintained in a turn-off state. During the holding time Th, due to a current between the source electrode and the drain electrode of the driving transistor DT, the source voltage (a DTS voltage) of the driving transistor DT may be lowered, and the drain voltage (a DTD voltage) of the driving transistor DT may increase. That is, for the holding time Th, the source voltage (the DTS voltage) and the drain voltage (the DTD voltage) of the driving transistor DT may be saturated to the same level. For the holding time Th, the gate voltage (a DTG voltage) of the driving transistor DT may be lowered according to a variation of the source voltage (the DTS voltage) due to coupling of the capacitor C.

For the emission time Te, the emission signal EM may allow a current to flow in the light emitting device EL, thereby allowing a pixel to emit light.

In the pixel circuit of FIG. 2A, since the first scan signal Scan1, the second scan signal Scan2, and the emission signal EM are input to the pixel circuit, the gate driving circuit should provide the first scan signal Scan1, the second scan signal Scan2, and the emission signal EM. Therefore, the gate driving circuit may include a first scan driving circuit, a second scan driving circuit, and an emission driving circuit. In this case, since the gate on voltage of the first scan signal Scan1 and the gate on voltage of the second scan signal Scan2 should be input to different transistors, the first scan driving circuit that provides the first scan signal Scan1 may generate a signal which is obtained by inverting the second scan signal Scan2 output from the second scan driving circuit.

Figure 3:
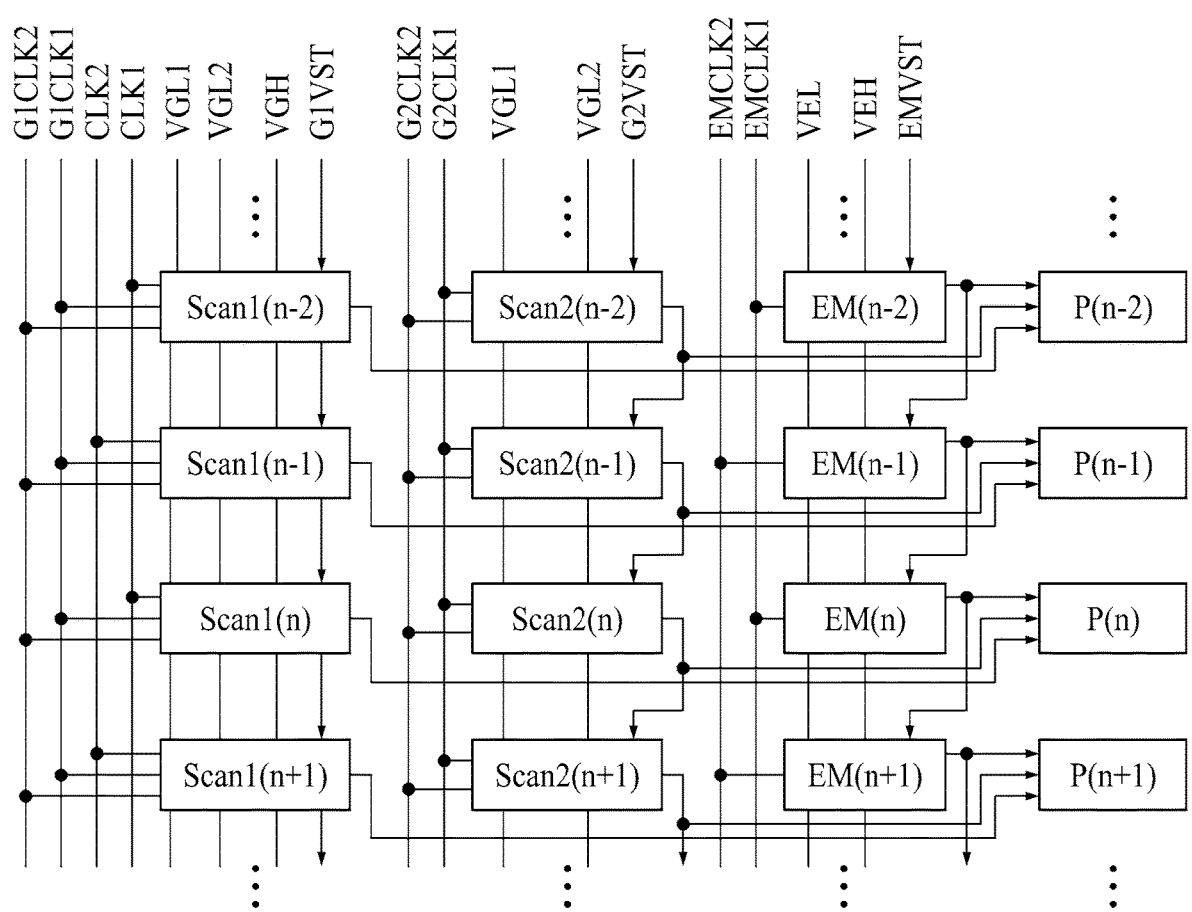
FIG. 3 is a block diagram illustrating a gate driving circuit according to an embodiment of the present disclosure.

FIG. 3 is a block diagram illustrating a gate driving circuit according to an embodiment of the present disclosure. FIG. 3 shows a gate signal applied to the pixel circuit of FIG. 2A. The gate driving circuit of FIG. 3 may be applied to the display panel illustrated in FIG. 1.

The gate driving circuit may include a first scan driving circuit, a second scan driving circuit, and an emission driving circuit. The first scan driving circuit, the second scan driving circuit, and the emission driving circuit may each include a plurality of stages each including a shift register. In FIG. 3, an (n−2)th stage, an (n−1)th stage, an nth stage, and an (n+1)th stage of the plurality of stages are illustrated for example.

The first scan driving circuit may include a plurality of first scan stages Scan1(n−2) to Scan1(n+1) and a plurality of lines through which a first gate clock signal1 G1CLK1, a first gate clock signal2 G1CLK2, a first clock signal CLK1, a second clock signal CLK2, a first gate low voltage VGL1, a second gate low voltage VGL2, a gate high voltage VGH, and a first gate start voltage G1VST input to the first scan stages are supplied. The first scan stages may shift the first gate start voltage G1VST to output an output signal, based on the first gate clock signal1 G1CLK1 and the first gate clock signal2 G1CLK2. Each of the first scan stages may output two output signals. For example, an nth first scan stage Scan1(n) may output a first output signal, which is input as a start signal for an (n+1)th first scan stage Scan1(n+1), and a second output signal which is input to a gate line of an nth pixel row P(n). In detail, the second output signal of the nth first scan stage Scan1(n) may correspond to a first scan signal Scan1 of the nth pixel row P(n).

The second scan driving circuit may include a plurality of second scan stages Scan2(n−2) to Scan2(n+1) and a plurality of lines through which a second gate clock signal1 G2CLK1, a second gate clock signal2 G2CLK2, the first gate low voltage VGL1, the gate high voltage VGH, and a second gate start voltage G2VST input to the second scan stages are supplied. The second scan stages may shift the second gate start voltage G2VST to output one output signal, based on the second gate clock signal1 G2CLK1 and the second gate clock signal2 G2CLK2. For example, an output signal of an nth second scan stage Scan2(n) may be input as a start signal for an (n+1)th second scan stage Scan2(n+1), and simultaneously, may be input to the gate line of the nth pixel row P(n). In detail, the output signal of the nth second scan stage Scan2(n) may correspond to a second scan signal Scan2 of the nth pixel row P(n).

The second scan signal Scan2 may be input to a gate electrode of a p-type transistor, and the first scan signal Scan1 may be input to a gate electrode of an n-type transistor. A gate on voltage VGH of the n-type transistor may be a voltage which is obtained by inverting a gate on voltage VGL of the p-type transistor. That is, the second scan signal Scan2 may be generated by inverting the first scan signal Scan1. Therefore, the first scan stages may be implemented by inverting an output signal of each of the second scan stages. In this case, a first output signal of each of the first scan stages may be the same as the output signal of each of the second scan stages, and thus, the first scan stages may be configured with a circuit configuring each of the second scan stages. Also, by additionally using the first clock signal CLK1 and the second clock signal CLK2, the first scan stages may generate an output signal which is obtained by inverting a signal output from each of the second scan stages.

The emission driving circuit may include a plurality of emission stages EM(n−2) to EM(n+1) and a plurality of lines through which an emission clock signal1 EMCLK1, an emission clock signal2 EMCLK2, an emission low voltage VEL, an emission high voltage VEH, and an emission start voltage EMVST input to the emission stages are applied. The emission stages may shift the emission start voltage EMVST to output one output signal, based on the emission clock signal1 EMCLK1 and the emission clock signal2 EMCLK2. For example, an output signal of an nth emission stage EM(n) may be input as a start signal for an (n+1)th emission stage EM(n+1) and may be input to the gate line of the nth pixel row P(n). In detail, the output signal of the nth emission stage EM(n) may correspond to an emission signal EM of the nth pixel row P(n).

The gate driving circuit is illustrated as a two-phase circuit that receives the first gate clock signal1 G1CLK1 and the first gate clock signal2 G1CLK2, the second gate clock signal1 G2CLK1 and the second gate clock signal2 G2CLK2, and the emission clock signal1 EMCLK1 and the emission clock signal2 EMCLK2 to operate, but is not limited thereto.

Figure 4:
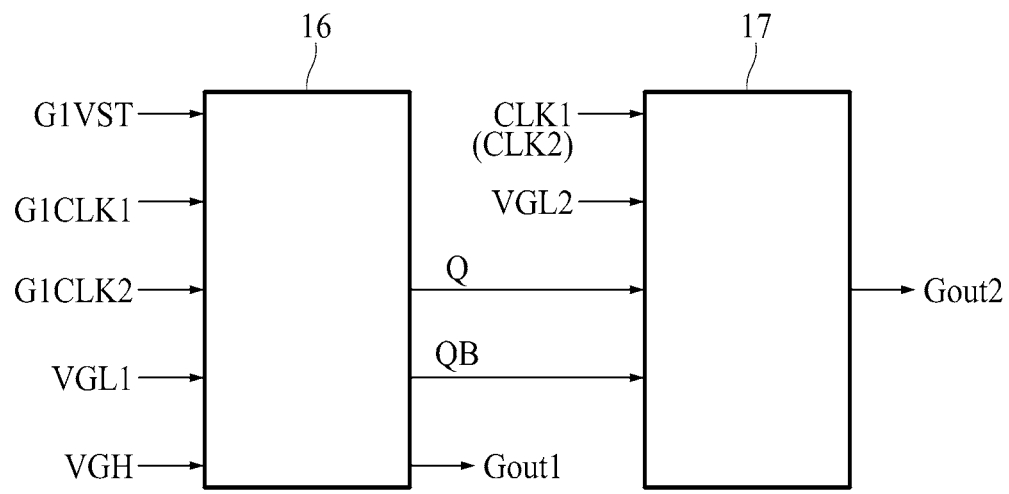
FIG. 4 is a block diagram of a first scan driving circuit according to an embodiment of the present disclosure.

FIG. 4 is a block diagram of a first scan driving circuit according to an embodiment of the present disclosure. In detail, FIG. 4 shows signals input to and output from a first scan stage.

As described above, the first scan stage may output a first output signal Gout1 and a second output signal Gout2. The first scan stage may include a first scan stage1 16, which is an element of the first scan stage outputting the first output signal Gout1, and a first scan stage2 17 which is another element of the first scan stage outputting the second output signal Gout2.

The first scan stage1 16 may operate based on a first gate start voltage G1VST, a first gate clock signal1 G1CLK1, a first gate clock signal2 G1CLK2, a first gate low voltage VGL1, and a gate high voltage VGH.

The first scan stage1 16 may output a signal corresponding to a logic high voltage or a logic low voltage through an output terminal through which the first output signal Gout1 is output, based on the first gate start voltage G1VST, the first gate clock signal1 G1CLK1, the first gate clock signal2 G1CLK2, the first gate low voltage VGL1, and the gate high voltage VGH. The first output signal Gout1 may be input as a start signal for a next stage.

The first scan stage2 17 may operate based on a first clock signal CLK1 or a second clock signal CLK2, a second gate low voltage VGL2, and a signal applied to a Q node and a QB node of the first scan stage1 16. Referring to FIG. 3, the first clock signal CLK1 and the second clock signal CLK2 may be alternately input to each of a plurality of first scan stages.

The first scan stage2 17 may output a signal corresponding to a logic high voltage or a logic low voltage through an output terminal through which the second output signal Gout2 is output, based on the first clock signal CLK1, the second gate low voltage VGL2, and the signal applied to the Q node and the QB node of the first scan stage1 16. The second output signal Gout2 may be input to a gate line of a pixel array. In detail, the second output signal Gout2 may correspond to the first scan signal Scan1 and may be input to the gate electrode of the first switch transistor ST1 which is an n-type transistor.

When the first output signal Gout1 is a logic high voltage, the second output signal Gout2 may be a logic low voltage, and when the first output signal Gout1 is a logic low voltage, the second output signal Gout2 may be a logic high voltage.

Figure 5:
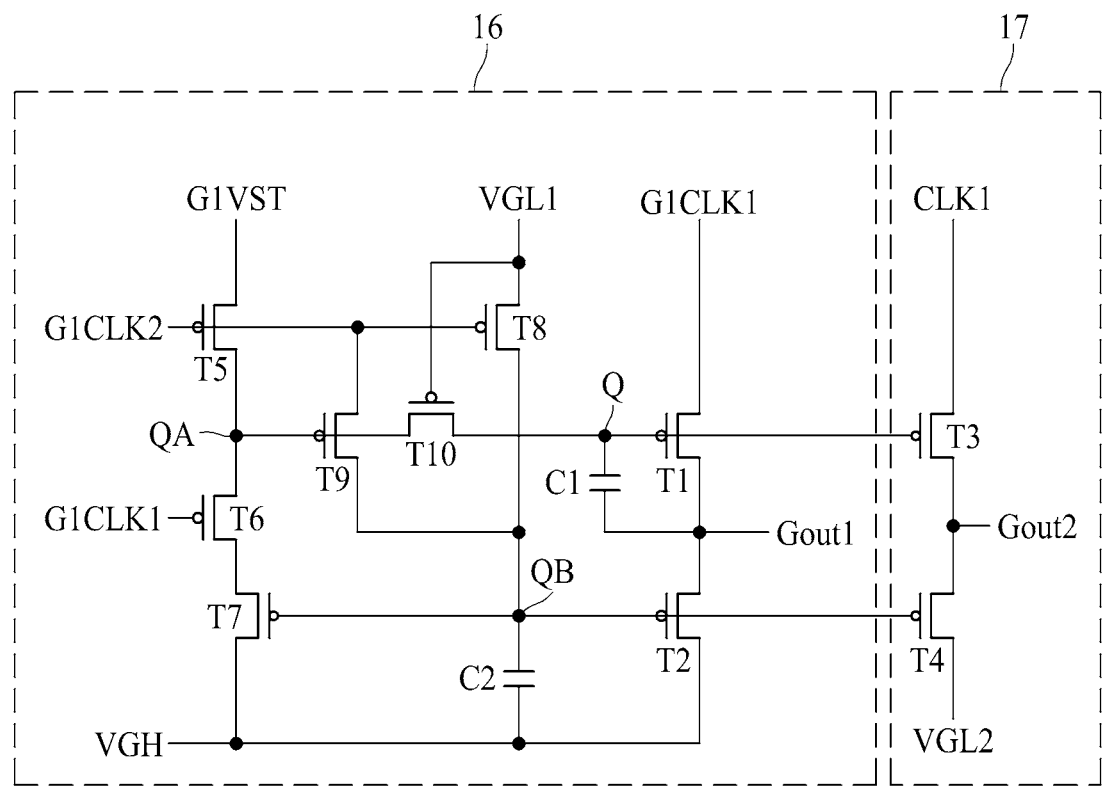
FIG. 5 is a circuit diagram illustrating a first scan driving circuit according to a first embodiment of the present disclosure.
Figure 6:
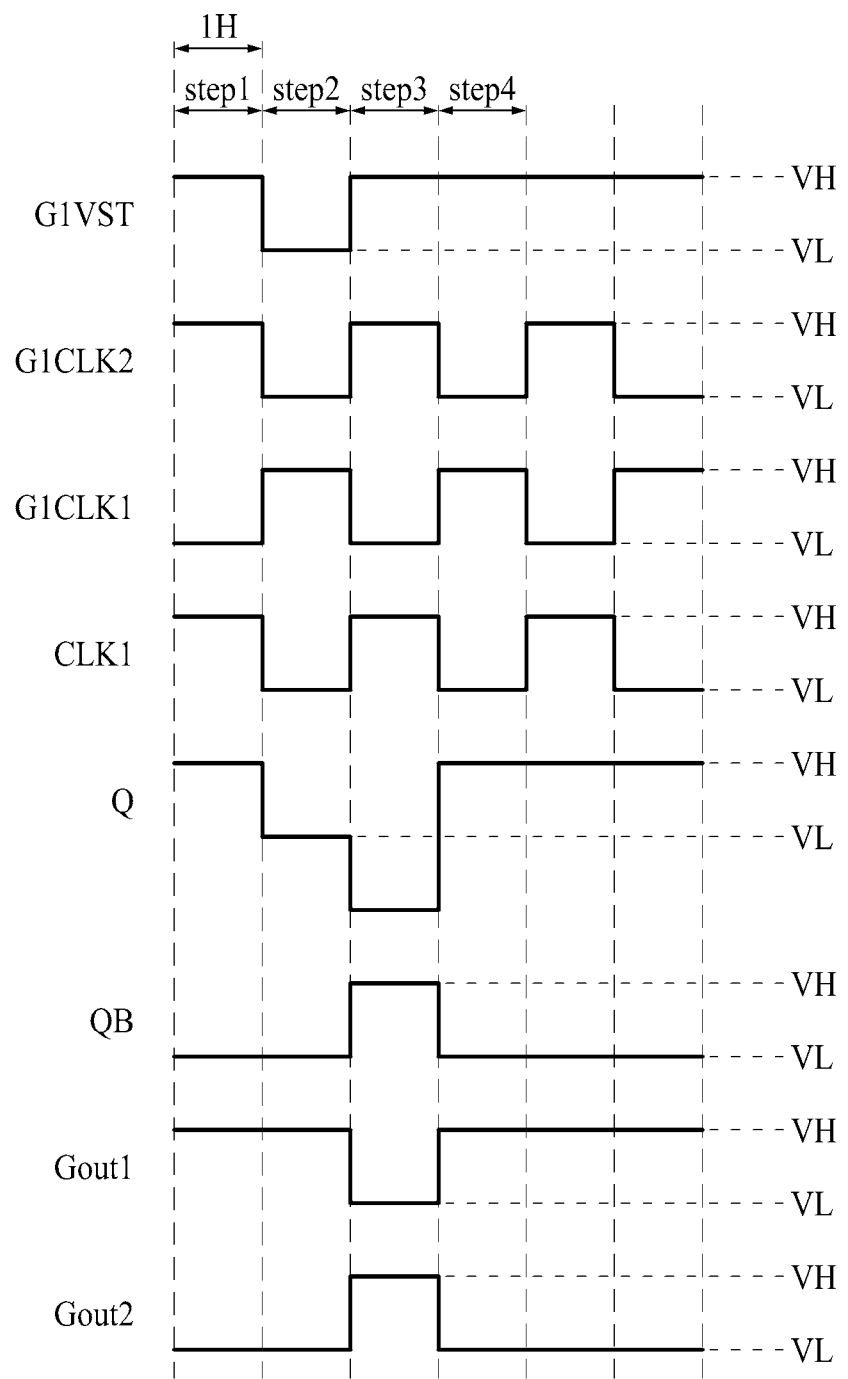
FIG. 6 is a waveform diagram of the first scan driving circuit illustrated in FIG. 5.

FIG. 5 is a circuit diagram illustrating a first scan driving circuit according to a first embodiment of the present disclosure. In detail, the first scan driving circuit configures each of a plurality of first scan stages, and the circuit diagram of FIG. 5 is a detailed circuit diagram of FIG. 4. FIG. 6 is a waveform diagram of the first scan driving circuit illustrated in FIG. 5 and is a waveform diagram when a QB node operates during one horizontal period 1H.

Referring to FIG. 5, all of a plurality of transistors configuring the first scan stages may be p-type transistors. The first scan stages may each include a first transistor T1, a second transistor T2, a third transistor T3, and a fourth transistor T4. A gate electrode of the first transistor T1 may be connected to a Q node Q, and a gate electrode of the second transistor T2 may be connected to a QB node QB. The Q node Q may charge the gate electrode of the first transistor T1, and the QB node QB may discharge the gate electrode of the second transistor T2. In this case, since the transistors configuring the first scan stages are p-type transistors, the charging may denote a turn-on voltage of a transistor, and the discharging may denote a turn-off voltage of the transistor.

A first gate clock signal1 G1CLK1 may be applied to a first electrode of the first transistor T1, and a gate high voltage VGH may be applied to a first electrode of the second transistor T2. The first transistor T1 and the second transistor T2 may be serially connected to each other, and thus, a second electrode of the first transistor T1 and a second electrode of the second transistor T2 may be connected to each other to share a node which generates a first output signal Gout1. Also, a first capacitor may be provided and may include a first electrode connected to the Q node Q and a second electrode which is shared by the second electrode of the first transistor T1 and the second electrode of the second transistor T2.

A gate electrode of the third transistor T3 may be connected to the Q node Q and the gate electrode of the first transistor T1, and a gate electrode of the fourth transistor T4 may be connected to the QB node QB and the gate electrode of the second transistor T2.

A first clock signal CLK1 may be applied to a first electrode of the third transistor T3, and a second gate low voltage VGL2 may be applied to a first electrode of the fourth transistor T4. The third transistor T3 and the fourth transistor T4 may be serially connected to each other, and thus, a second electrode of the third transistor T3 and a second electrode of the fourth transistor T4 may be connected to each other to share a node which generates a second output signal Gout2.

As described above, a first gate start voltage G1VST, the first gate clock signal1 G1CLK1, a first gate clock signal2 G1CLK2, the first clock signal CLK1, the gate high voltage VGH, a first gate low voltage VGL1, and the second gate low voltage VGL2 may be applied to each of the first scan stages.

Referring to FIG. 6, driving waveforms of the first scan stages are divided into a first step step1, a second step step2, a third step step3, and a fourth step step4 and will be described.

In the first step step1, the first gate start voltage G1VST, the first gate clock signal2 G1CLK2, and the first clock signal CLK1 may have a logic high voltage VH, and the first gate clock signal1 G1CLK1 may be a signal obtained by inverting the first gate clock signal2 G1CLK2 and may have a logic low voltage VL. In this case, since the logic high voltage VH is applied to the Q node Q, the first transistor T1 and the third transistor T3 may be turned off, and since the logic low voltage VL is applied to the QB node QB, the second transistor T2 and the fourth transistor T4 may be turned on, whereby the first output signal Gout1 may be the gate high voltage VGH and the second output signal Gout2 may be the second gate low voltage VGL2. The gate high voltage VGH may be a same voltage as the logic high voltage VH, and the second gate low voltage VGL2 may be a voltage which is equal to or higher than the logic low voltage VL. In this case, the second gate low voltage VGL2 and the logic low voltage VL may each be a negative voltage.

In the second step step2, the first gate start voltage G1VST, the first gate clock signal2 G1CLK2, and the first clock signal CLK1 may be inverted into the logic low voltage VL, and the first gate clock signal1 G1CLK1 may be inverted into the logic high voltage VH. In this case, since the logic low voltage VL of the first gate start voltage G1VST is applied to the Q node Q, the first transistor T1 and the third transistor T3 may be turned on, and the QB node QB may maintain the logic low voltage VL, whereby the second transistor T2 and the fourth transistor T4 may maintain a turn-on state. Therefore, since the first gate clock signal1 G1CLK1 and the gate high voltage VGH are output, the first output signal Gout1 may be the logic high voltage VH, and since the first clock signal CLK1 and the second gate low voltage VGL2 are output, the second output signal Gout2 may be the logic low voltage VL.

In the third step step3, the first gate start voltage G1VST, the first gate clock signal2 G1CLK2, and the first clock signal CLK1 may be inverted into the logic high voltage VH, and the first gate clock signal1 G1CLK1 may be inverted into the logic low voltage VL. In this case, the logic low voltage VL of the first gate clock signal1 G1CLK1 may be applied to the second electrode of the first transistor T1 through the turned-on first transistor T1, and thus, a voltage of the floated Q node Q may be lowered to a voltage lower than the logic low voltage VL due to the bootstrap of the first capacitor C1. Therefore, the first transistor T1 stably maintains a turn-on state, and thus, the first output signal Gout1 stably maintains the logic low voltage VL. The third transistor T3 may also be turned on by a voltage applied to the Q node Q, and thus, the first clock signal CLK1 may be output, whereby the second output signal Gout2 may become the logic high voltage VH. Simultaneously, the logic high voltage VH may be applied to the QB node QB, and thus, the second transistor T2 and the fourth transistor T4 may be turned off.

In the fourth step step4, the first gate start voltage G1VST may maintain the logic high voltage VH, and the first gate clock signal1 G1CLK1, the first gate clock signal2 G1CLK2, and the first clock signal CLK1 may be inverted. In this case, since the logic high voltage VH of the first gate start voltage G1VST is applied to the Q node Q, the first transistor T1 and the third transistor T3 may be turned off, and the first gate low voltage VGL1 may be applied to the QB node QB, whereby the second transistor T2 and the fourth transistor T4 may be turned on. Therefore, the first output signal Gout1 may be the gate high voltage VGH and the second output signal Gout2 may be the second gate low voltage VGL2. The first gate low voltage VGL1 may be a voltage which is equal to the logic low voltage VL and is lower than the second gate low voltage VGL2.

Since the fourth transistor T4 is a p-type transistor, when an absolute value of a voltage difference between the gate electrode and the source electrode (i.e., the first electrode) of the fourth transistor T4 connected to the QB node QB is less than an absolute value of a threshold voltage of the fourth transistor T4, the fourth transistor T4 may not be turned on, and thus, the second output signal Gout2 may not be output, or an output of the second output signal Gout2 may be delayed. Therefore, an eighth transistor T8 may be turned on, and thus, when the first gate low voltage VGL1 is applied to the QB node QB, the second gate low voltage VGL2 which is higher than the first gate low voltage VGL1 may be applied to the first electrode of the fourth transistor T4 so as to turn on the fourth transistor T4. In this case, the first gate low voltage VGL1 and the second gate low voltage VGL2 may each be a negative or minus voltage. For example, an absolute value of the first gate low voltage VGL1 may be greater than that of the second gate low voltage VGL2.

FIG. 5 illustrates, for example, a circuit where the QB node QB has the logic high voltage VH during only one horizontal period 1H. In the second step step2 and the fourth step step4, since all of the Q node Q and the QB node QB have the logic low voltage VL, the third transistor T3 and the fourth transistor T4 may be turned on, and thus, the second output signal Gout2 may stably become the logic low voltage VL due to the first clock signal CLK1 and the second gate low voltage VGL2. Also, each of the first scan stages may provide the first output signal Gout1 and the second output signal Gout2 which are inverted therebetween.

Therefore, in the first embodiment of the present disclosure, since the first and third transistors T1 and T3 where the gate electrode is connected to the Q node Q and the second and fourth transistors T2 and T4 where the gate electrode is connected to the QB node QB are provided, an inverted output waveform may be generated without using an inverter driving circuit, thereby decreasing a size of the gate driving circuit.

And, in addition to the first and third transistors T1 and T3 connected to the Q node Q and the second and fourth transistors T2 and T4 connected to the QB node QB for generating the first output signal Gout1 and the second output signal Gout2 which are inverted therebetween, a circuit which is connected to the Q node Q and the QB node QB to charge/discharge the Q node Q and the QB node QB will be described below.

A line supplied the first gate clock signal2 G1CLK2 may be connected to a gate electrode of a fifth transistor T5, a line supplied the first gate start voltage G1VST may be connected to a first electrode of the fifth transistor T5, and a QA node QA may be connected to a second electrode of the fifth transistor T5.

A line supplied the first gate clock signal1 G1CLK1 may be connected to a gate electrode of a sixth transistor T6, the QA node QA and the second electrode of the fifth transistor T5 may be connected to a first electrode of the sixth transistor T6, and a first electrode of a seventh transistor T7 may be connected to a second electrode of the sixth transistor T6.

The QB node QB may be connected to a gate electrode of the seventh transistor T7, the second electrode of the sixth transistor T6 may be connected to the first electrode of the seventh transistor T7, and a line supplied the gate high voltage VGH may be connected to a second electrode of the seventh transistor T7.

A line supplied the first gate clock signal2 G1CLK2 and the gate electrode of the fifth transistor T5 may be connected to a gate electrode of the eighth transistor T8, a line supplied the first gate low voltage VGL1 may be connected to a first electrode of the eighth transistor T8, and the QB node QB, the gate electrode of the second transistor T2, and the gate electrode of the seventh transistor T7 may be connected to a second electrode of the eighth transistor T8.

The QA node QA, the second electrode of the fifth transistor T5, and the first electrode of the sixth transistor T6 may be connected to a gate electrode of a ninth transistor T9, a line supplied the first gate clock signal2 G1CLK2, the gate electrode of the fifth transistor T5, and the gate electrode of the eighth transistor T8 may be connected to a first electrode of the ninth transistor T9, and the QB node QB, the second electrode of the eighth transistor T8, the gate electrode of the second transistor T2, and the gate electrode of the seventh transistor T7 may be connected to a second electrode of the ninth transistor T9.

A line supplied the first gate low voltage VGL1 may be connected to a gate electrode of a tenth transistor T10, the QA node QA, the second electrode of the fifth transistor T5, and the first electrode of the sixth transistor T6 may be connected to a first electrode of the tenth transistor T10, and the Q node Q and the gate electrode of the first transistor T1 may be connected to a second electrode of the tenth transistor T10.

Since the first gate low voltage VGL1 is applied to the gate electrode of the tenth transistor T10, the tenth transistor T10 may maintain a turn-on state. Therefore, the same voltage may be applied to the QA node QA and the Q node Q. In the third step step3 corresponding to a time when a scan stage provides an output signal, a voltage of the Q node Q may be lowered to a voltage lower than the logic low voltage VL due to bootstrap. For example, in a case where the tenth transistor T10 is omitted, the Q node Q may become a node which is the same as the QA node QA, and the fifth transistor T5, the sixth transistor T6, and the ninth transistor T9 may be connected to the QA node QA. Since the fifth transistor T5, the sixth transistor T6, and the ninth transistor T9 connected to the QA node QA is affected by the bootstrap, a threshold characteristic of each of the fifth transistor T5, the sixth transistor T6, and the ninth transistor T9 may be biased. Therefore, since the tenth transistor T10 is provided, the reliability of the fifth transistor T5, the sixth transistor T6, and the ninth transistor T9 based on a bias stress is enhanced. In some cases, the tenth transistor T10 may always maintain a turn-on state as a buffer against the bias stress, and thus, may be omitted.

The scan stages may include a first capacitor C1 and a second capacitor C2. A first electrode of the first capacitor C1 may be connected to the Q node Q, and a second electrode of the first capacitor C1 may be connected to a node through which the first output signal Gout1 is output. A first electrode of the second capacitor C2 may be connected to the QB node QB, and a second electrode of the second capacitor C2 may be connected to a line supplied the gate high voltage VGH.

Referring to FIGS. 5 and 6, when the first gate clock signal2 G1CLK2 is the logic low voltage VL, the fifth transistor T5 may be turned on to apply the first gate start voltage G1VST to the Q node Q. In the second step step2 where the first gate clock signal2 G1CLK2 is the logic low voltage VL, since the first gate start voltage G1VST is the logic low voltage VL, the logic low voltage VL may be applied to the Q node Q, and thus, the first transistor T1 and the third transistor T3 may be turned on. Simultaneously, the eighth transistor T8 and the ninth transistor T9 may be turned on, and thus, the logic low voltage VL may be applied to the QB node QB. Accordingly, in the second step step2, the second transistor T2 and the fourth transistor T4 may be turned on.

In the third step step3, in a state where the fifth transistor T5 and the eighth transistor T8 are turned off and thus the Q node Q is floated, a voltage of the Q node Q may be lowered to a voltage lower than the logic low voltage VL by the logic low voltage VL applied to the second electrode of the first transistor T1. The ninth transistor T9 of which the gate electrode is connected to the Q node Q may be turned on, and thus, the logic high voltage VH of the first gate clock signal2 G1CLK2 may be applied to the QB node QB. The second transistor T2, the fourth transistor T4, and the seventh transistor T7 respectively including the gate electrodes connected to the QB node QB may be turned off, and the sixth transistor T6 may be turned on by the first gate clock signal1 G1CLK1. Therefore, the logic high voltage VH is stably applied to the Q node Q.

In one frame period, the first output signal Gout1 may be the logic low voltage VL during one horizontal period 1H, and during the other period, the first output signal Gout1 may maintain the logic high voltage VH. Likewise, in one frame period, the second output signal Gout2 may be the logic high voltage VH during one horizontal period 1H, and during the other period, the second output signal Gout2 may maintain the logic low voltage VL. While the first output signal Gout1 maintains the logic high voltage VH and the second output signal Gout2 maintains the logic low voltage VL, the eighth transistor T8 may be repeatedly turned on or turned off by the first gate clock signal2 G1CLK2. While the eighth transistor T8 is turned on, the first gate low voltage VGL1 may be applied to the QB node QB to turn on the second transistor T2 and the fourth transistor T4, and while the eighth transistor T8 is turned off, the second capacitor C2 may maintain a voltage of the QB node QB as the first gate low voltage VGL1.

The first gate clock signal2 G1CLK2 and the first clock signal CLK1 may be signals generated from different oscillators, and phases of the clock signals may differ.

Figure 7:
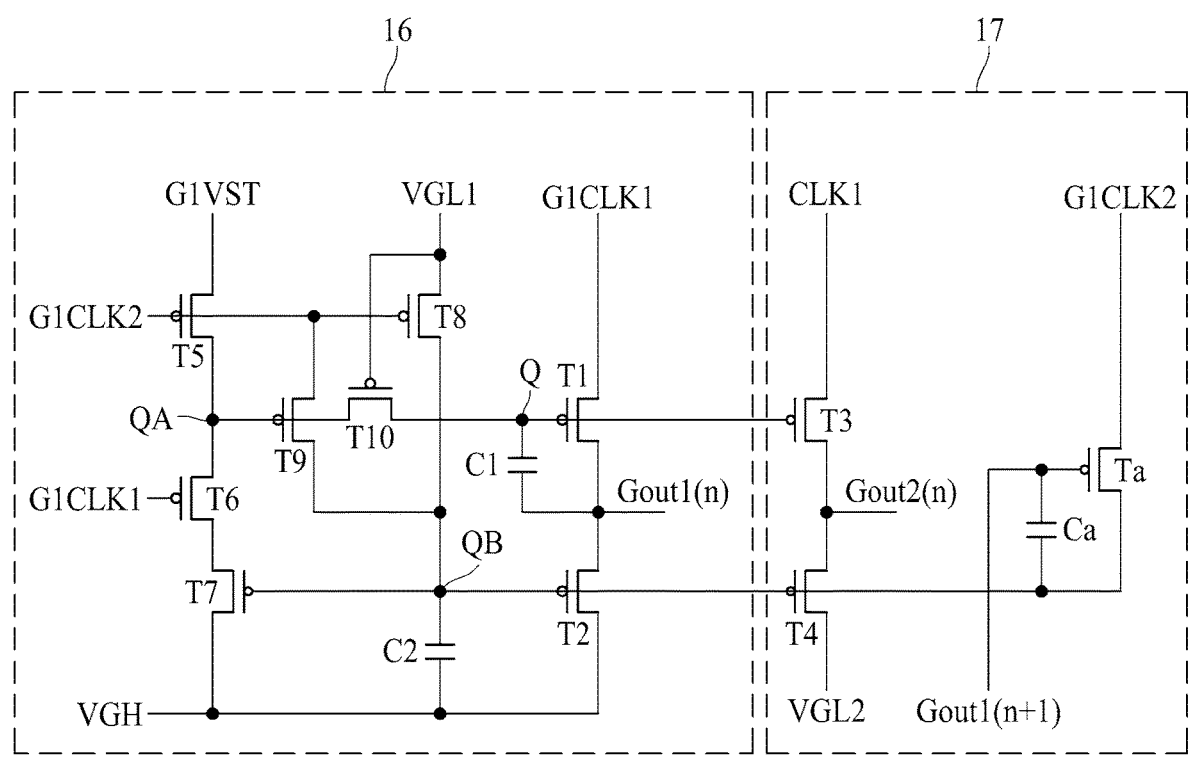
FIG. 7 is a circuit diagram illustrating a first scan driving circuit according to a second embodiment of the present disclosure.
Figure 8:
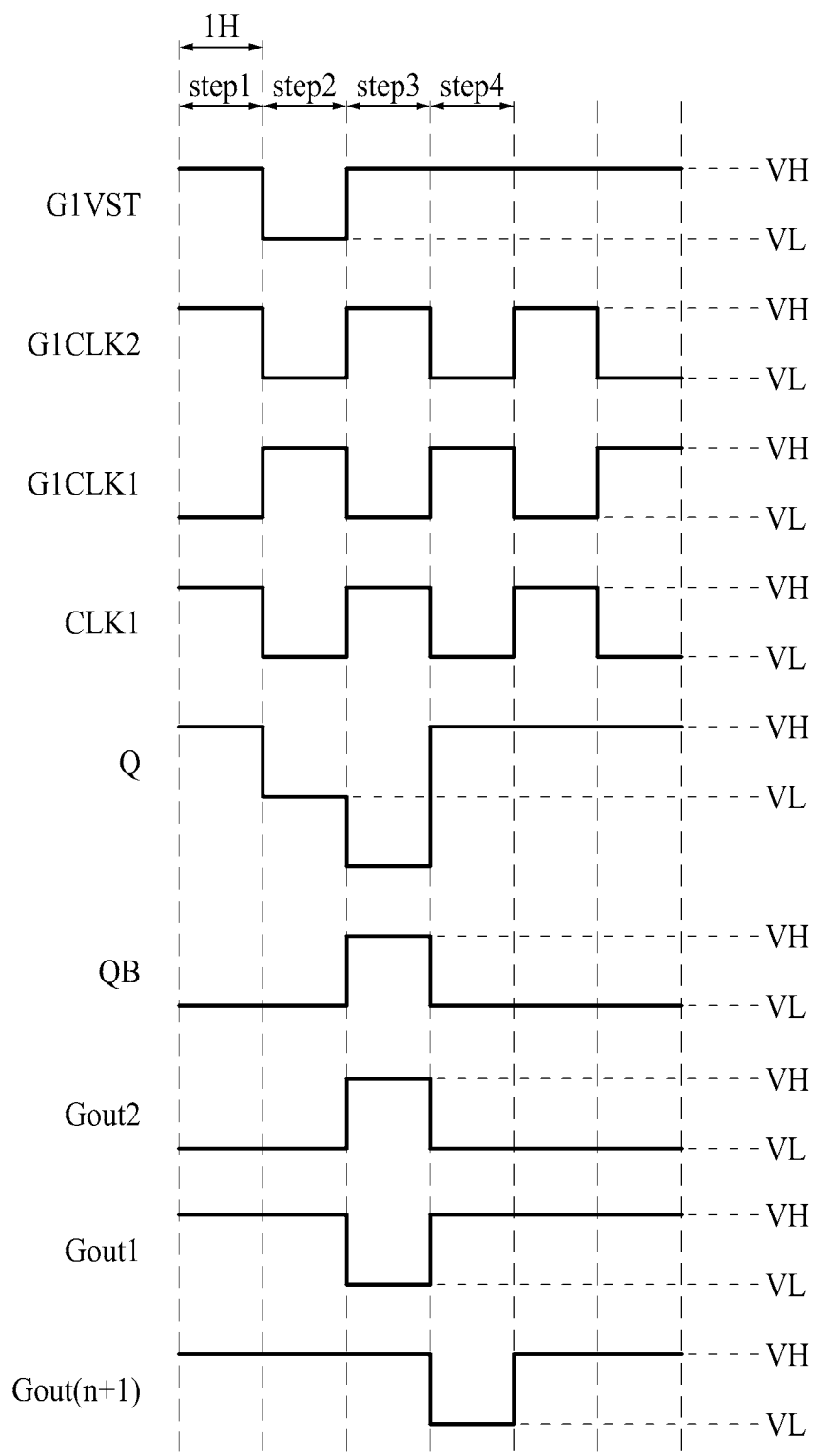
FIG. 8 is a waveform diagram of the first scan driving circuit illustrated in FIG. 7.

FIG. 7 is a circuit diagram illustrating a first scan driving circuit according to a second embodiment of the present disclosure. In detail, the first scan driving circuit configures each of a plurality of first scan stages, and the circuit diagram of FIG. 7 is a detailed circuit diagram of FIG. 4. FIG. 8 is a waveform diagram of the first scan driving circuit illustrated in FIG. 7 and is a waveform diagram when a QB node operates during one horizontal period 1H. FIG. 7 illustrates a modification embodiment of the first scan driving circuit of FIG. 5, and thus, description repetitive of FIG. 5 is omitted or will be briefly described. For example, an nth first scan stage will be described below with reference to FIG. 7.

Referring to FIG. 7, as described above with reference to FIG. 5, a second gate low voltage VGL2 which is higher than a first gate low voltage VGL1 may be applied to a first electrode of a fourth transistor T4, for turning on the fourth transistor T4. The second gate low voltage VGL2 may vary based on a condition of the fourth transistor T4. For example, when the fourth transistor T4 is deteriorated and thus a threshold voltage of the fourth transistor T4 is negative-shifted, the second gate low voltage VGL2 should use a high voltage in proportion to a degree to which the threshold voltage of the fourth transistor T4 is shifted. For this reason, a stress is more applied to the fourth transistor T4, causing a reduction in reliability. Therefore, in the second embodiment of the present disclosure, an auxiliary transistor Ta and an auxiliary capacitor Ca may be additionally connected to a QB node QB, and thus, the second gate low voltage VGL2 is prevented from increasing. Also, by using the bootstrap of the auxiliary capacitor Ca, a voltage of the QB node QB may be lowered to a voltage which is lower than a logic low voltage VL, and thus, the fourth transistor T4 may be turned on, and a second output signal Gout2 may be stably output.

FIG. 7 illustrates an embodiment where the auxiliary transistor Ta and the auxiliary capacitor Ca are further added to the circuit of FIG. 5. A gate electrode of the auxiliary transistor Ta may be connected to a first output signal Gout1($n$+1) of an (n+1)th first scan stage, a first electrode of the auxiliary transistor Ta may be connected to a first gate clock signal2 G1CLK2, and a second electrode of the auxiliary transistor Ta may be connected to the QB node QB, a gate electrode of a second transistor T2, a gate electrode of the fourth transistor T4, and a gate electrode of a seventh transistor T7. A first electrode of the auxiliary capacitor Ca may be connected to the gate electrode of the auxiliary transistor Ta and the first output signal Gout1($n$+1) of the (n+1)th first scan stage, and a second electrode of the auxiliary capacitor Ca may be connected to the second electrode of the auxiliary transistor Ta, the QB node QB, the gate electrode of the second transistor T2, the gate electrode of the fourth transistor T4, and the gate electrode of the seventh transistor T7.

Referring to FIGS. 7 and 8, in a fourth step step4, the auxiliary transistor Ta may be turned on, and thus, the first gate clock signal2 G1CLK2 may be input to the QB node QB, and simultaneously, a voltage of the QB node QB may be lower than the logic low voltage VL by the first output signal Gout1($n$+1) of the (n+1)th first scan stage due to the bootstrap of the auxiliary capacitor Ca. Therefore, a voltage difference between the gate electrode and a second electrode of the fourth transistor T4 may increase, and thus, the logic low voltage VL may be stably output as a second output signal Gout2($n$) of an nth first scan stage.

According to the second embodiment of the present disclosure, since the auxiliary transistor Ta and the auxiliary capacitor Ca are further provided, the logic low voltage VL may be stably output as the second output signal Gout2($n$) of the nth first scan stage in the fourth step step4.

Figure 9:
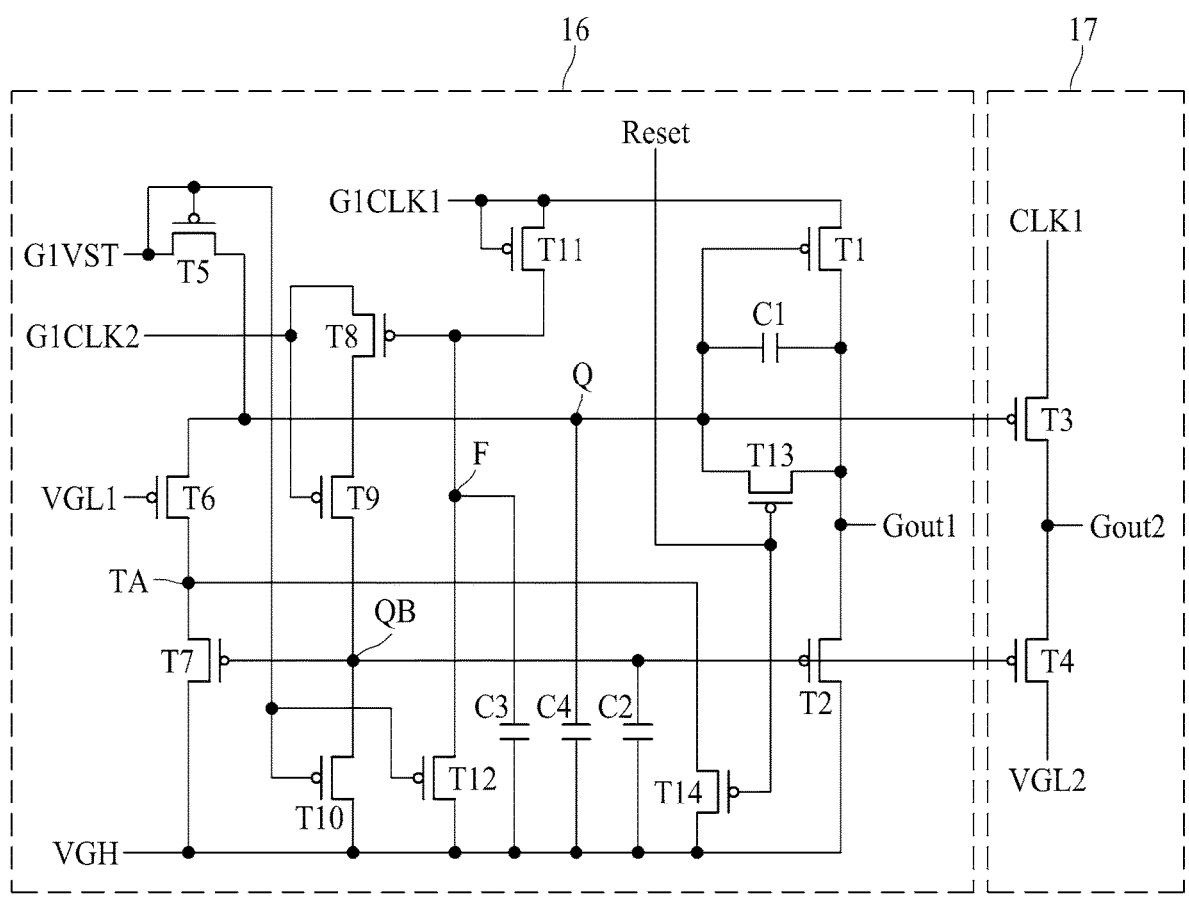
FIG. 9 is a circuit diagram illustrating a first scan driving circuit according to a third embodiment of the present disclosure.
Figure 10:
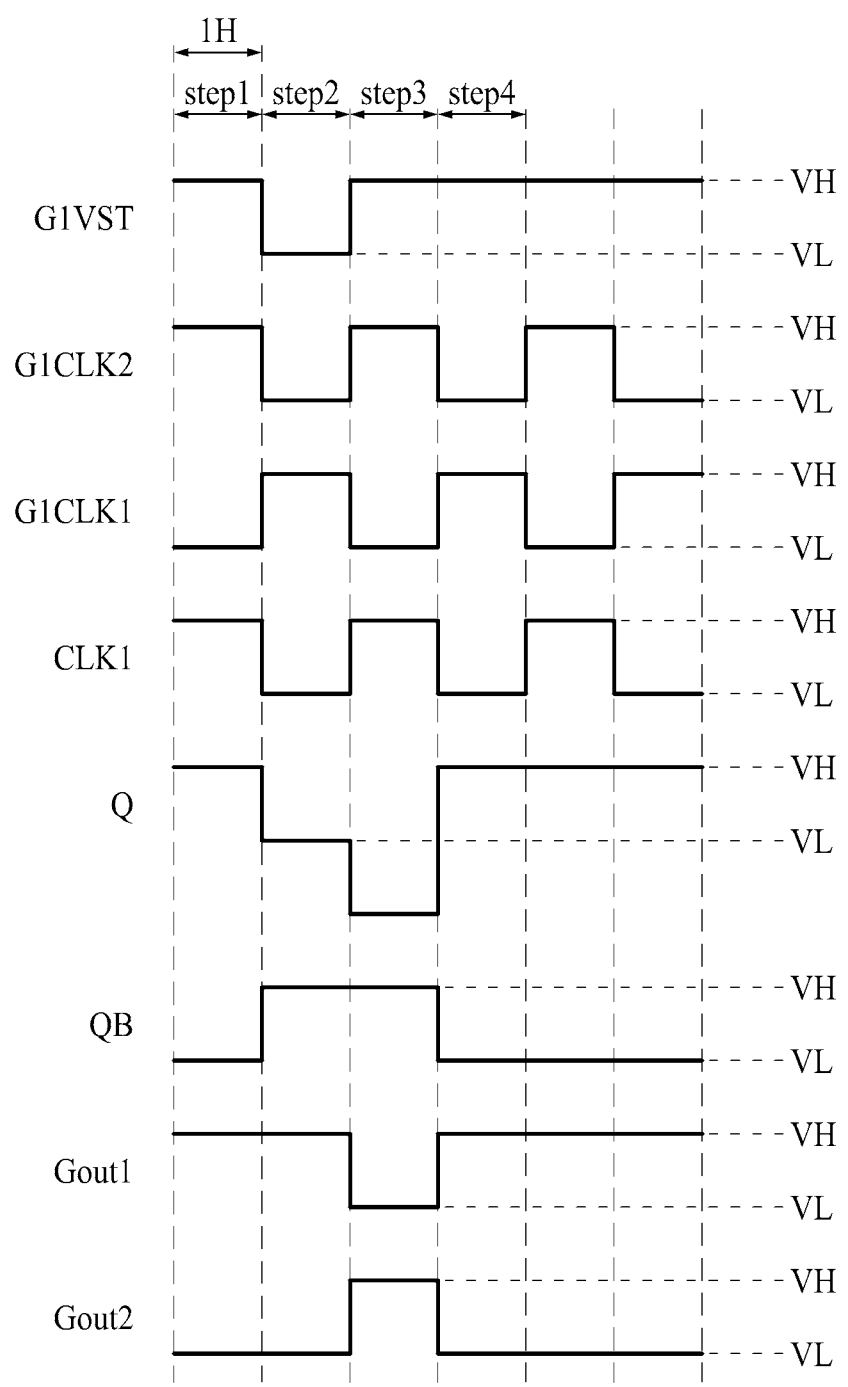
FIG. 10 is a waveform diagram of the first scan driving circuit illustrated in FIG. 9.

FIG. 9 is a circuit diagram illustrating a first scan driving circuit according to a third embodiment of the present disclosure. In detail, the first scan driving circuit configures each of a plurality of first scan stages, and the circuit diagram of FIG. 9 is a detailed circuit diagram of FIG. 4. FIG. 10 is a waveform diagram of the first scan driving circuit illustrated in FIG. 9 and is a waveform diagram when a QB node operates during two horizontal periods 2H.

Referring to FIG. 9, the first scan stages may each include a first transistor T1, a second transistor T2, a third transistor T3, and a fourth transistor T4. A gate electrode of the first transistor T1 may be connected to a Q node Q, and a gate electrode of the second transistor T2 may be connected to a QB node QB. The Q node Q may charge the gate electrode of the first transistor T1, and the QB node QB may discharge the gate electrode of the second transistor T2. In this case, since the transistors configuring the first scan stages are p-type transistors, the charging may denote a turn-on voltage of a transistor, and the discharging may denote a turn-off voltage of the transistor.

A first gate clock signal1 G1CLK1 may be applied to a first electrode of the first transistor T1, and a gate high voltage VGH may be applied to a first electrode of the second transistor T2. The first transistor T1 and the second transistor T2 may be serially connected to each other, and thus, a second electrode of the first transistor T1 and a second electrode of the second transistor T2 may be connected to each other to share a node which generates a first output signal Gout1. And, a first capacitor may be provided and may include a first electrode connected to the Q node Q and a second electrode which is shared by the second electrode of the first transistor T1 and the second electrode of the second transistor T2.

A gate electrode of the third transistor T3 may be connected to the Q node Q and the gate electrode of the first transistor T1, and a gate electrode of the fourth transistor T4 may be connected to the QB node QB and the gate electrode of the second transistor T2.

A first clock signal CLK1 may be applied to a first electrode of the third transistor T3, and a second gate low voltage VGL2 may be applied to a first electrode of the fourth transistor T4. The third transistor T3 and the fourth transistor T4 may be serially connected to each other, and thus, a second electrode of the third transistor T3 and a second electrode of the fourth transistor T4 may be connected to each other to share a node which generates a second output signal Gout2.

A first gate start voltage G1VST, the first gate clock signal1 G1CLK1, a first gate clock signal2 G1CLK2, the first clock signal CLK1, a gate high voltage VGH, the first gate low voltage VGL1, the second gate low voltage VGL2, and a reset signal Reset may be applied to each of the first scan stages according to the third embodiment of the present disclosure.

Referring to FIG. 10, driving waveforms of the first scan stages are divided into a first step step1, a second step step2, a third step step3, and a fourth step step4 will be described.

In the first step step1, the first gate start voltage G1VST, the first gate clock signal2 G1CLK2, and the first clock signal CLK1 may have a logic high voltage VH, and the first gate clock signal1 G1CLK1 may be a signal obtained by inverting the first gate clock signal2 G1CLK2 and may have a logic low voltage VL. In this case, since the logic high voltage VH is applied to the Q node Q, the first transistor T1 and the third transistor T3 may be turned off, and since the logic low voltage VL is applied to the QB node QB, the second transistor T2 and the fourth transistor T4 may be turned on, whereby the first output signal Gout1 may be the gate high voltage VGH and the second output signal Gout2 may be the second gate low voltage VGL2. The gate high voltage VGH may be a voltage which is the same as the logic high voltage VH, and the second gate low voltage VGL2 may be a voltage which is equal to or higher than the logic low voltage VL.

In the second step step2, the first gate start voltage G1VST, the first gate clock signal2 G1CLK2, and the first clock signal CLK1 may be inverted into the logic low voltage VL, and the first gate clock signal1 G1CLK1 may be inverted into the logic high voltage VH. In this case, since the logic low voltage VL of the first gate start voltage G1VST is applied to the Q node Q, the first transistor T1 and the third transistor T3 may be turned on, and the gate high voltage VGH may be applied to the QB node QB, whereby the second transistor T2 and the fourth transistor T4 may be turned off. Therefore, since the first gate clock signal1 G1CLK1 and the gate high voltage VGH are output, the first output signal Gout1 may maintain the logic high voltage VH, and the second output signal Gout2 may maintain the second gate low voltage VGL2.

In the third step step3, the first gate start voltage G1VST, the first gate clock signal2 G1CLK2, and the first clock signal CLK1 may be inverted into the logic high voltage VH, and the first gate clock signal1 G1CLK1 may be inverted into the logic low voltage VL. In this case, the logic low voltage VL of the first gate clock signal1 G1CLK1 may be applied to the second electrode of the first transistor T1 through the turned-on first transistor T1, and thus, a voltage of the floated Q node Q may be lowered to a voltage lower than the logic low voltage VL due to the bootstrap of the first capacitor C1. Therefore, the first transistor T1 stably maintains a turn-on state, and thus, the first output signal Gout1 stably maintains the logic low voltage VL. The third transistor T3 may also be turned on by a voltage applied to the Q node Q, and thus, the first clock signal CLK1 may be output, whereby the second output signal Gout2 may become the logic high voltage VH. Simultaneously, the logic high voltage VH may be applied to the QB node QB, and thus, the second transistor T2 and the fourth transistor T4 may be turned off.

In the fourth step step4, the first gate start voltage G1VST may maintain the logic high voltage VH, and the first gate clock signal1 G1CLK1, the first gate clock signal2 G1CLK2, and the first clock signal CLK1 may be inverted. In this case, since the logic high voltage VH of the first gate start voltage G1VST is applied to the Q node Q, the first transistor T1 and the third transistor T3 may be turned off, and the logic low voltage VL of the first gate clock signal2 G1CLK2 may be applied to the QB node QB, whereby the second transistor T2 and the fourth transistor T4 may be turned on. Therefore, the first output signal Gout1 may be the gate high voltage VGH and the second output signal Gout2 may be the second gate low voltage VGL2. The first gate low voltage VGL1 may be a voltage which is equal to the logic low voltage VL and is higher than the second gate low voltage VGL2.

Since the fourth transistor T4 is a p-type transistor, when an absolute value of a voltage difference between the gate electrode and the source electrode (i.e., the first electrode) of the fourth transistor T4 connected to the QB node QB is less than an absolute value of a threshold voltage of the fourth transistor T4, the fourth transistor T4 may not be turned on, and thus, the second output signal Gout2 may not be output, or an output of the second output signal Gout2 may be delayed. Therefore, an eighth transistor T8 and a ninth transistor T9 may be turned on, and thus, when the logic low voltage VL of the first gate clock signal2 G1CLK2 is applied to the QB node QB, the second gate low voltage VGL2 which is higher than the logic low voltage VL may be applied to the first electrode of the fourth transistor T4 so as to turn on the fourth transistor T4. In this case, the logic low voltage VL and the second gate low voltage VGL2 may each be a negative voltage. As described above, the logic low voltage VL may be a voltage which is equal to the first gate low voltage VGL1.

Therefore, in the third embodiment of the present disclosure, since the first and third transistors T1 and T3 where the gate electrode is connected to the Q node Q and the second and fourth transistors T2 and T4 where the gate electrode is connected to the QB node QB are provided, an inverted output waveform may be generated without using an inverter driving circuit, thereby decreasing a size of the gate driving circuit.

Moreover, in addition to the first and third transistors T1 and T3 connected to the Q node Q and the second and fourth transistors T2 and T4 connected to the QB node QB for generating the first output signal Gout1 and the second output signal Gout2 which are inverted therebetween, a circuit which is connected to the Q node Q and the QB node QB to charge/discharge the Q node Q and the QB node QB will be described below.

FIG. 9 illustrates, for example, a circuit where the QB node QB has the logic high voltage VH during two horizontal periods 2H. In the second step step2 and the third step step3, since the QB node QB maintains the logic high voltage VH, the second transistor T2 and the fourth transistor T4 may be turned off, and thus, the first output signal Gout1 and the second output signal Gout2 may be provided by the first transistor T1 and the third transistor T3. Also, each of the first scan stages may provide the first output signal Gout1 and the second output signal Gout2 which are inverted therebetween.

The first gate start voltage G1VST may be connected to a gate electrode and a first electrode of a fifth transistor T5, and the Q node Q may be connected to a second electrode of the fifth transistor T5.

A line supplied the first gate low voltage VGL1 may be connected to a gate electrode of a sixth transistor T6, the Q node Q and the second electrode of the fifth transistor T5 may be connected to a first electrode of the sixth transistor T6, and a TA node TA may be connected to a second electrode of the sixth transistor T6.

The QB node QB may be connected to a gate electrode of a seventh transistor T7, the TA node TA and the second electrode of the sixth transistor T6 may be connected to a first electrode of the seventh transistor T7, and a line supplied the gate high voltage VGH may be connected to a second electrode of the seventh transistor T7.

An F node F may be connected to a gate electrode of the eighth transistor T8, a line supplied the first gate clock signal2 G1CLK2 may be connected to a first electrode of the eighth transistor T8, and a first electrode of the ninth transistor T9 may be connected to a second electrode of the eighth transistor T8.

A line supplied the first gate clock signal2 G1CLK2 and the first electrode of the eighth transistor T8 may be connected to a gate electrode of the ninth transistor T9, the second electrode of the eighth transistor T8 may be connected to a first electrode of the ninth transistor T9, and the QB node QB and the gate electrode of the seventh transistor T7 may be connected to a second electrode of the ninth transistor T9.

The first gate start voltage G1VST may be applied to a gate electrode of a tenth transistor T10, the QB node QB and the gate electrode of the seventh transistor T7 may be connected to a first electrode of the tenth transistor T10, and a lined supplied the gate high voltage VGH and the second electrode of the seventh transistor T7 may be connected to a second electrode of the tenth transistor T10.

A line supplied the first gate clock signal1 G1CLK1 may be connected to a gate electrode and a first electrode of an eleventh transistor T11, and the gate electrode of the eighth transistor T8 and the F node F may be connected to a second electrode of the eleventh transistor T11.

A line supplied the first gate start voltage G1VST and the gate electrode of the tenth transistor T10 may be connected to a gate electrode of a twelfth transistor T12. The F node F, the gate electrode of the eighth transistor T8, and the second electrode of the eleventh transistor T11 may be connected to a first electrode of the twelfth transistor T12. And a line supplied the gate high voltage VGH, the second electrode of the tenth transistor T10, and the second electrode of the seventh transistor T7 may be connected to a second electrode of the twelfth transistor T12.

A line supplied the reset signal Reset may be connected to a gate electrode of a thirteenth transistor T13, the Q node Q, the second electrode of the fifth transistor T5, and the first electrode of the sixth transistor T6 may be connected to a first electrode of the thirteenth transistor T13. And a line supplied the first output signal Gout1 and the second electrode of the first transistor T1 may be connected to a second electrode of the thirteenth transistor T13. The reset signal Reset may initialize the first output signal Gout1 by applying the logic low voltage VL before driving the first scan stage or after driving of the first scan stage ends. When the logic low voltage VL is applied as the reset signal Reset, the thirteenth transistor T13 and a fourteenth transistor T14 may be turned on, and thus, the gate high voltage VGH may be output as the first output signal Gout1, thereby initializing the first output signal Gout1.

The gate electrode of the thirteenth transistor T13 and a line supplied the reset signal Reset may be connected to a gate electrode of the fourteenth transistor T14, the Q node Q, the second electrode of the fifth transistor T5, and the first electrode of the sixth transistor T6 may be connected to a first electrode of the fourteenth transistor T14. And a line supplied the gate high voltage VGH, the first electrode of the second transistor T2, the second electrode of the twelfth transistor T12, the second electrode of the tenth transistor T10, and the second electrode of the seventh transistor T7 may be connected to a second electrode of the fourteenth transistor T14.

The first scan stages may each include a first capacitor C1, a second capacitor C2, a third capacitor C3, and a fourth capacitor C4. A first electrode of the first capacitor C1 may be connected to the Q node Q, and a second electrode of the first capacitor C1 may be connected to a node through which the first output signal Gout1 is output. A first electrode of the second capacitor C2 may be connected to the QB node QB, and a second electrode of the second capacitor C2 may be connected to a line supplied the gate high voltage VGH. A first electrode of the third capacitor C3 may be connected to the F node F, and a second electrode of the third capacitor C3 may be connected to a line supplied the gate high voltage VGH. A first electrode of the fourth capacitor C4 may be connected to the Q node Q, and a second electrode of the fourth capacitor C4 may be connected to a line supplied the gate high voltage VGH.

Referring to FIGS. 9 and 10, in the second step step2, the fifth transistor T5 may be turned on by the first gate start voltage G1VST, and the first gate start voltage G1VST may be applied to the Q node Q. Since the first transistor T1 is turned on by the first gate start voltage G1VST, the logic high voltage VH may be applied to the second electrode of the first capacitor C1, and the logic low voltage VL which is a voltage of the Q node Q may be applied to the first electrode of the first capacitor C1, whereby the first capacitor C1 may be charged with a voltage corresponding to a voltage difference between the logic high voltage VH and the logic low voltage VL. Likewise, the fourth capacitor C4 of which the first electrode is connected to the Q node Q may also be charged with a voltage corresponding to the voltage difference between the logic high voltage VH and the logic low voltage VL. In this case, the logic high voltage VH may be equal to the gate high voltage VGH.

The tenth transistor T10 and the twelfth transistor T12 may also be turned on by the first gate start voltage G1VST, and thus, the gate high voltage VGH may be applied to the QB node QB and the F node F. The ninth transistor T9 may be turned on by the first gate clock signal2 G1CLK2, but the gate high voltage VGH of the F node F may turn off the eighth transistor T8, thereby allowing the logic low voltage VL of the first gate clock signal2 G1CLK2 not to be applied to the QB node QB. Also, the second capacitor C2 and the third capacitor C3 may be discharged by the gate high voltage VGH of each of the QB node QB and the F node F.

In the second step step2 where the first gate clock signal2 G1CLK2 is the logic low voltage VL, since the first gate start voltage G1VST is the logic low voltage VL, the logic low voltage VL may be applied to the Q node Q, and thus, the first transistor T1 and the third transistor T3 may be turned on. Simultaneously, the tenth transistor T10 may be turned on, and thus, the logic high voltage VH may be applied to the QB node QB, whereby the second transistor T2 and the fourth transistor T4 may be turned off. Accordingly, in the second step step2, the first output signal Gout1 and the second output signal Gout2 may be output as a voltage applied through the first transistor T1 and the third transistor T3.

In the third step step3, the fifth transistor T5 and the tenth transistor T10 may be turned off, and thus, the Q node Q and the QB node QB may be floated. The logic low voltage VL of the first gate clock signal1 G1CLK1 may be applied to the second electrode of the first transistor T1 which is in a turn-on state, and thus, a voltage of the Q node Q may be lowered to a voltage lower than the logic low voltage VL due to the bootstrap of the first capacitor C1, whereby the logic low voltage VL may be stably provided as the first output signal Gout1 and the second output signal Gout2. The voltage of the Q node Q may be maintained by the fourth capacitor C4. The eleventh transistor T11 may be turned on by the first gate clock signal1 G1CLK1 to apply the logic low voltage VL to the F node F, and thus, the third capacitor C3 may be charged with a voltage corresponding to a voltage difference between the logic low voltage VL and the gate high voltage VGH.

The sixth transistor T6 may always maintain a turn-on state according to the first gate low voltage VGL1. The sixth transistor T6 prevents the TA node TA from being bootstrapped when the Q node Q is bootstrapped, and thus, a stress applied to the seventh transistor T7 is reduced, thereby enhancing a reliability of the seventh transistor T7.

Since the logic high voltage VH is maintained in the floated QB node QB, the seventh transistor T7, the second transistor T2, and the fourth transistor T4 may maintain a turn-off state. Accordingly, in the third step step3, the first output signal Gout1 and the second output signal Gout2 may be output as a voltage applied through the first transistor T1 and the third transistor T3.

In the fourth step step4, the ninth transistor T9 may be turned on by the logic low voltage VL of the first gate clock signal2 G1CLK2, and the eighth transistor T8 may be turned on by the logic low voltage VL charged into the third capacitor C3 in the third step step3, whereby the logic low voltage VL of the first gate clock signal2 G1CLK2 may be applied to the QB node QB. The seventh transistor T7 may be turned on by the QB node QB, and thus, the gate high voltage VGH may be applied to the Q node Q through the sixth transistor T6 which always maintains a turn-on state, whereby the first transistor T1 and the third transistor T3 may be turned off. Also, the second transistor T2 and the fourth transistor T4 may be turned on by the QB node QB. The logic low voltage VL applied to the QB node QB may be applied to the first electrode of the second capacitor C2, and thus, the second capacitor C2 may be charged with a voltage corresponding to a voltage difference between the logic low voltage VL and the gate high voltage VGH, whereby the QB node QB may maintain the logic low voltage VL during one frame period. Accordingly, in the fourth step step4, the first output signal Gout1 and the second output signal Gout2 may be output as a voltage applied through the second transistor T2 and the fourth transistor T4.

The gate driving circuit and the display device including the same according to the embodiments of the present disclosure will be described below.

In an embodiment of the present disclosure, a display device comprises a substrate including a display area and a non-display area, a pixel circuit in the display area, and a pair of scan driving circuits in the non-display area, the pair of scan driving circuits generating output signals inverted therebetween. The pixel circuit includes at least one n-type transistor and at least one p-type transistor. One of the pair of scan driving circuits comprises a first transistor and a third transistor each including a gate electrode connected to a first node and a second transistor and a fourth transistor each including a gate electrode connected to a second node, the first transistor and the second transistor are serially connected to each other, and the third transistor and the fourth transistor are serially connected to each other. A second output signal applied to a node shared by the third transistor and the fourth transistor is a signal obtained by inverting a first output signal applied to a node shared by the first transistor and the second transistor. Accordingly, the number of elements of the gate driving circuit for providing a gate signal to the n-type transistor and the p-type transistor is reduced to enhance reliability, and an area where the gate driving circuit is disposed is reduced, thereby implementing a narrow-bezel display device.

According to one or more embodiments, a gate clock signal may be input to one electrode of the first transistor, a first clock signal may be input to one electrode of the third transistor, and the gate clock signal and the first clock signal may be clock signals inverted therebetween.

According to one or more embodiments, a gate high voltage may be provided to one electrode of the second transistor, and a second gate low voltage may be provided to one electrode of the fourth transistor.

According to one or more embodiments, the node applied the second output signal may be connected to a gate electrode of the at least one n-type transistor, a first gate low voltage may be input to the one of the scan driving circuit generating the first output signal, and the second gate low voltage may be higher than the first gate low voltage.

According to one or more embodiments, the pixel circuit may comprise a driving transistor and a scan transistor, the driving transistor may be a p-type transistor, and the scan transistor may be an n-type transistor.

According to one or more embodiments, the scan transistor may comprise an oxide semiconductor layer, and the scan transistor may apply a data voltage, input to one electrode of the scan transistor, to a gate electrode of the driving transistor.

In an embodiment of the present disclosure, a gate driving circuit comprises a first scan driving circuit and a second scan driving circuit on a substrate. The first scan driving circuit and the second scan driving circuit each comprise a plurality of first scan stages and a plurality of second scan stages, an nth (where n is a natural number) first scan stage of the plurality of first scan stages and an nth second scan stage of the plurality of second scan stages each include the same circuit including a first transistor and a second transistor serially connected to each other, the nth first scan stage includes a third transistor connected to a gate electrode of the first transistor and a fourth transistor connected to a gate electrode of the second transistor, and an output signal of the nth first scan stage is generated by inverting an output signal of the nth second scan stage. Accordingly, the number of elements of the gate driving circuit for generating output signals inverted therebetween is reduced to enhance a reliability of the gate driving circuit.

According to one or more embodiments, a clock signal input to one electrode of the first transistor and a clock signal input to one electrode of the third transistor may be signals inverted therebetween.

According to one or more embodiments, a gate high voltage may be provided to one electrode of the second transistor, and a second gate low voltage may be applied to one electrode of the fourth transistor.

According to one or more embodiments, the nth first scan stage may be provided with a first gate low voltage, and an absolute value of the first gate low voltage may be greater than an absolute value of the second gate low voltage.

According to one or more embodiments, the nth first scan stage may further comprise an auxiliary capacitor and an auxiliary transistor, a first electrode of the auxiliary capacitor may be connected to a gate electrode of the auxiliary transistor and an (n+1)th first scan stage, a second electrode of the auxiliary capacitor may be connected to a gate electrode of the fourth transistor and a second electrode of the auxiliary transistor, and the first electrode of the auxiliary transistor may be connected to a gate clock signal.

In another embodiment of the present disclosure, a display device comprises a substrate including a display area and a non-display area, a pixel circuit in the display area, and a gate driving circuit in the non-display area. The gate driving circuit comprises a scan driving circuit, the scan driving circuit comprises a plurality of scan stages, the plurality of scan stages each include a first transistor and a third transistor each including a gate electrode connected to a Q node, and a second transistor and a fourth transistor each including a gate electrode connected to a QB node, and an output signal generated in a node shared by the third transistor and the fourth transistor serially connected to each other is a signal obtained by inverting an output signal generated in a node shared by the first transistor and the second transistor serially connected to each other. Accordingly, the number of elements of the gate driving circuit for providing a gate signal to the n-type transistor and the p-type transistor is reduced to enhance reliability, and an area where the gate driving circuit is disposed is reduced, thereby implementing a narrow-bezel display device.

According to one or more embodiments, the plurality of scan stages may be connected to a line input a clock signal which swings between a logic high voltage and a logic low voltage at every one horizontal period, and the QB node may maintain a gate high voltage or the logic high voltage during two horizontal periods.

According to one or more embodiments, a clock signal may be input to one electrode of the first transistor, a clock signal may be input to one electrode of the third transistor, and the clock signals may be inverted therebetween.

According to one or more embodiments, a gate high voltage may be provided to one electrode of the second transistor, and a second gate low voltage may be provided to one electrode of the fourth transistor.

According to one or more embodiments, the plurality of scan stages may be provided with a first gate low voltage, and the second gate low voltage may be higher than the first gate low voltage.

According to one or more embodiments, the pixel circuit may comprise a driving transistor and a scan transistor, the driving transistor may be a p-type transistor, the scan transistor may be an n-type transistor, and each of the plurality of scan stages may be connected to a gate electrode of the scan transistor.

According to one or more embodiments, the scan transistor may comprise an oxide semiconductor layer.

As described above, according to the embodiments of the present disclosure, since the first and third transistors respectively including the gate electrodes connected to the Q node are provided and the second and fourth transistors respectively including the gate electrodes connected to the QB node are provided, an output waveform which is inverted without using the inverter driving circuit may be generated, and thus, a size of the gate driving circuit is reduced.

Moreover, according to the embodiments of the present disclosure, the second gate low voltage input to one electrode of the fourth transistor including the gate electrode connected to the QB node may use a voltage higher than the first gate low voltage input to the scan driving circuit, thereby solving a problem where an output of the second output signal is delayed because the fourth transistor is not turned on or the turn-on is delayed.

Moreover, according to the embodiments of the present disclosure, since the auxiliary transistor and the auxiliary capacitor are additionally connected to the QB node, the second gate low voltage is prevented from increasing due to a negative shift of the threshold voltage of the fourth transistor, and thus, a stress of the fourth transistor is reduced. Also, by lowering a voltage of the QB node to a voltage lower than a logic low voltage by using the bootstrap of the auxiliary capacitor, the fourth transistor may be turned on, and the second output signal may be stably output.

Moreover, according to the embodiments of the present disclosure, since the scan driving circuit is configured to have a logic high voltage in only the third step and have a logic low voltage in the second step and the fourth step (i.e., in a case where the QB node is driven during one horizontal period (1H)), the fourth transistor may be turned on in the second step previous to the third step where the inverted second output signal (i.e., a logic high voltage) is output and the fourth step subsequent to the third step, a logic low voltage is more stably applied.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:
1. A display device comprising:
   a substrate including a display area and a non-display area;
   a pixel circuit in the display area, wherein the pixel circuit comprises at least one n-type transistor and at least one p-type transistor; and
a scan driving circuit in the non-display area, the scan driving circuit comprising a plurality of scan stages, at least one of the plurality of scan stages comprising:
a first transistor and a third transistor each including a gate electrode connected to a first node; and
a second transistor and a fourth transistor each including a gate electrode connected to a second node,
wherein a gate high voltage is input to one electrode of the second transistor, a first gate low voltage is input to a gate electrode of the fourth transistor, and a second gate low voltage is input to one electrode of the fourth transistor,
wherein the second gate low voltage is higher than the first gate low voltage,
wherein the first transistor and the second transistor are serially connected to each other, and the third transistor and the fourth transistor are serially connected to each other,
wherein a second output signal applied to a node shared by the third transistor and the fourth transistor is a signal obtained by inverting a first output signal applied to a node shared by the first transistor and the second transistor, and
wherein a gate clock signal is input to one electrode of the first transistor, a first clock signal is input to one electrode of the third transistor, and the gate clock signal and the first clock signal are clock signals inverted therebetween.

2. The display device of claim 1, wherein the node applied the second output signal is connected to a gate electrode of the at least one n-type transistor.

3. The display device of claim 1, wherein the pixel circuit comprises a driving transistor and a scan transistor, and
the driving transistor is a p-type transistor, and the scan transistor is an n-type transistor.

4. The display device of claim 3, wherein the scan transistor comprises an oxide semiconductor layer, and the scan transistor applies a data voltage, input to one electrode of the scan transistor, to a gate electrode of the driving transistor.

5. The display device of claim 1, wherein the one electrode of the first transistor is a drain electrode of the first transistor, and wherein the one electrode of the third transistor is a drain electrode of the third transistor.

6. A gate driving circuit comprising:
a first scan driving circuit and a second scan driving circuit on a substrate,
wherein the first scan driving circuit and the second scan driving circuit each comprise a plurality of first scan stages and a plurality of second scan stages,
wherein an nth (where n is a natural number) first scan stage of the plurality of first scan stages and an nth second scan stage of the plurality of second scan stages each comprise a first transistor and a second transistor serially connected to each other,
wherein the nth first scan stage further comprises a third transistor connected to a gate electrode of the first transistor and a fourth transistor connected to a gate electrode of the second transistor,
wherein a gate high voltage is input to one electrode of the second transistor,
wherein the nth first scan stage is provided with a first gate low voltage, the first gate low voltage is input to a gate electrode of the fourth transistor,
wherein a second gate low voltage is input to one electrode of the fourth transistor, and the second gate low voltage is higher than the first gate low voltage,
wherein an output signal of the nth first scan stage is an inverted signal of an output signal of the nth second scan stage, and
wherein a clock signal input to one electrode of the first transistor and another clock signal input to one electrode of the third transistor are signals inverted therebetween.

7. The gate driving circuit of claim 6, wherein
the nth first scan stage further comprises an auxiliary capacitor and an auxiliary transistor,
a first electrode of the auxiliary capacitor is connected to a gate electrode of the auxiliary transistor and an (n+1)th first scan stage,
a second electrode of the auxiliary capacitor is connected to the gate electrode of the fourth transistor and a first electrode of the auxiliary transistor, and
a second electrode of the auxiliary transistor is connected to a gate clock signal.

8. The gate driving circuit of claim 6, wherein the one electrode of the first transistor is a drain electrode of the first transistor, and wherein the one electrode of the third transistor is a drain electrode of the third transistor.

9. A display device comprising:
a substrate including a display area and a non-display area;
a pixel circuit in the display area; and
a gate driving circuit in the non-display area, wherein the gate driving circuit comprises a scan driving circuit, the scan driving circuit comprises a plurality of scan stages, and the plurality of scan stages each comprise:
a first transistor and a third transistor each including a gate electrode connected to a Q node; and
a second transistor and a fourth transistor each including a gate electrode connected to a QB node,
wherein a gate high voltage is input to one electrode of the second transistor,
wherein the plurality of scan stages is provided with a first gate low voltage, the first gate low voltage is input to a gate electrode of the fourth transistor,
wherein a second gate low voltage is input to one electrode of the fourth transistor and the second gate low voltage is higher than the first gate low voltage,
wherein an output signal generated in a node shared by the third transistor and the fourth transistor serially connected to each other is a signal obtained by inverting an output signal generated in a node shared by the first transistor and the second transistor serially connected to each other, and
wherein a gate clock signal is input to one electrode of the first transistor, a first clock signal is input to one electrode of the third transistor, and the gate clock signal and the first clock signal are clock signals inverted therebetween.

10. The display device of claim 9, wherein the plurality of scan stages are connected to a line input a clock signal which swings between a logic high voltage and a logic low voltage at every one horizontal period, and the QB node maintains a gate high voltage or the logic high voltage during two horizontal periods.

11. The display device of claim 9, wherein
the pixel circuit comprises a driving transistor and a scan transistor,
the driving transistor is a p-type transistor, and the scan transistor is an n-type transistor, and each of the plurality of scan stages is connected to a gate electrode of the scan transistor.

12. The display device of claim 11, wherein the scan transistor comprises an oxide semiconductor layer.

13. The display device of claim 9, wherein the one electrode of the first transistor is a drain electrode of the first transistor, and wherein the one electrode of the third transistor is a drain electrode of the third transistor.

* * * * *